US007710036B2

(12) United States Patent
Cha et al.

(10) Patent No.: US 7,710,036 B2
(45) Date of Patent: May 4, 2010

(54) FILTER AND PLASMA DISPLAY DEVICE

(75) Inventors: Hong Rae Cha, Seoul (KR); Ji Hoon Sohn, Seoul (KR); Sam Je Cho, Seoul (KR); Woo Sung Jang, Seoul (KR); Woon Seo Shin, Seoul (KR)

(73) Assignee: LG Electronics Inc., Seoul (KR)

( * ) Notice: Subject to any disclaimer, the term of this patent is extended or adjusted under 35 U.S.C. 154(b) by 257 days.

(21) Appl. No.: 11/855,802

(22) Filed: Sep. 14, 2007

(65) Prior Publication Data

US 2008/0106198 A1 May 8, 2008

(30) Foreign Application Priority Data

Nov. 6, 2006 (KR) ...................... 10-2006-0108675

(51) Int. Cl.
*H01J 17/49* (2006.01)
*H05K 9/00* (2006.01)

(52) U.S. Cl. ....................... 313/582; 313/584; 313/461; 313/110; 313/587; 359/453

(58) Field of Classification Search ....................... None
See application file for complete search history.

(56) References Cited

U.S. PATENT DOCUMENTS

| | | | | |
|---|---|---|---|---|
| 6,297,590 | B1 * | 10/2001 | Nanto et al. | 313/586 |
| 6,657,387 | B1 * | 12/2003 | Yoo | 313/587 |
| 6,733,869 | B2 * | 5/2004 | Arakawa et al. | 428/195.1 |
| 7,271,955 | B2 * | 9/2007 | Osawa et al. | 359/453 |
| 7,371,450 | B2 * | 5/2008 | Arakawa et al. | 428/138 |
| 2008/0018247 | A1 * | 1/2008 | Park et al. | 313/582 |
| 2008/0197773 | A1 * | 8/2008 | Cha et al. | 313/582 |

FOREIGN PATENT DOCUMENTS

| | | |
|---|---|---|
| KR | 1020000067640 | 11/2000 |
| KR | 1020030034426 | 5/2003 |
| KR | 1020040085765 | 10/2004 |
| KR | 1020050029205 | 3/2005 |
| KR | 1020060065110 | 6/2006 |

OTHER PUBLICATIONS

Korean Intellectual Property Office (KIPO) Notice of Prelimiary Rejection, Jan. 25, 2007, Applications No. 10-2006-0108675, 11 pages total (including English translation).

(Continued)

*Primary Examiner*—Sikha Roy
(74) *Attorney, Agent, or Firm*—Fish & Richardson P.C.

(57) ABSTRACT

A display apparatus includes a plasma display panel (PDP) and a filter having a panel side facing a display surface of the PDP and an opposing viewer side facing away from the display surface. The filter includes an external light shield having a first base unit and first pattern units. The first pattern units absorb external light from the viewer side and are substantially parallel to a first axis. The filter includes an electromagnetic interference (EMI) shield overlapping the external light shield. The EMI shield includes a second base unit and second pattern units. The second pattern units are conductive and substantially parallel to a second axis. An interior angle between the first axis and the second axis can be within a range of 40 to 50 degrees.

19 Claims, 16 Drawing Sheets

OTHER PUBLICATIONS

KIPO Notice of Final Rejection, May 22, 2007, Application No. 10-2006-0108675, 5 pages total (including English translation).

KIPO Notice of Allowance, Aug. 16, 2007, Application No. 10-2006-0108675, 7 pages total (including English translation).

* cited by examiner

FILTER AND PLASMA DISPLAY DEVICE

This application claims priority from Korean Patent Application No. 10-2006-0108675 filed on Nov. 6, 2006, in the Korean Intellectual Property Office, the entirety of which is incorporated herein by reference.

BACKGROUND

1. Field

This disclosure relates to a filter and a plasma display device using the filter in which an external light shield sheet for shielding external light incident upon a plasma display panel (PDP) is disposed at a front of the PDP, so that the bright room contrast of the PDP can be improved and so that the luminance of the PDP can be uniformly maintained.

2. Description of the Related Art

Generally, plasma display panels (PDPs) display images including text and graphic images by applying a predetermined voltage to a number of electrodes installed in a discharge space to cause a gas discharge and then exciting phosphors with the aid of plasma that is generated as a result of the gas discharge. PDPs can be manufactured as large-dimension, light and thin flat displays. In addition, PDPs can provide wide vertical and horizontal viewing angles, full colors and high luminance.

External light incident upon a PDP may be reflected by an entire surface of the PDP due to white phosphors that are exposed on a lower substrate of the PDP. For this reason, PDPs may mistakenly recognize black images as being brighter than they actually are, thereby causing contrast degradation.

SUMMARY

In one general aspect, a display apparatus comprises a plasma display panel (PDP) having a display surface. The display device further comprises a filter having a panel side facing the display surface of the PDP and an opposing viewer side facing away from the display surface of the PDP. The filter includes an external light shield having a first base unit and first pattern units. The first pattern units have boundaries defined by intersections of the first pattern units and the first base unit. The first pattern units absorb external light from the viewer side. The first pattern units are substantially parallel to a first axis.

An electromagnetic interference (EMI) shield overlaps the external light shield. The EMI shield includes a second base unit, second pattern units substantially parallel to a second axis and having boundaries defined by intersections of the second pattern units and the second base unit, and third pattern units substantially parallel to a third axis and having boundaries defined by intersections of the third pattern units and the second base unit. The second and third pattern units are conductive and intersect in a mesh configuration.

The second axis is more aligned with the first axis relative to an alignment of the third axis with the first axis. An interior angle between the first axis and a longitudinal axis of the external light shield is 20 degrees or less. An interior angle between the second axis and a longitudinal axis of the EMI shield is within a range of 25 to 60 degrees. An interior angle between the third axis and the longitudinal axis of the EMI shield is within a range of 27.5 to 60 degrees. An interior angle between the first axis and the second axis is within a range of 20 to 60 degrees. An interior angle between the first axis and the third axis is within a range of 28 to 65 degrees. An exterior angle between the second axis and the third axis is within a range of 60 to 127.5 degrees.

Implementations can include one or more of the following features. For example, the interior angle between the first axis and the longitudinal axis of the external light shield can be 5 degrees or less. The interior angle between the second axis and the longitudinal axis of the EMI shield can be within a range of 30 to 55 degrees. The interior angle between the third axis and the longitudinal axis of the EMI shield can be within a range of 32.5 to 55 degrees.

The interior angle between the first axis and the second axis can be within a range of 40 to 50 degrees. The interior angle between the first axis and the third axis can be within a range of 40 to 50 degrees. The exterior angle between the second axis and the third axis can be within a range of 70 to 117.5 degrees.

In some implementations, the display apparatus further comprises black matrices disposed at the PDP. The black matrices are substantially parallel to a fourth axis. The interior angle between the first axis and the longitudinal axis of the external light shield is the same as an interior angle between the first axis and the fourth axis.

In another general aspect, a display apparatus comprises a plasma display panel (PDP) having a display surface. The display apparatus further comprises a filter having a panel side facing the display surface of the PDP and an opposing viewer side facing away from the display surface of the PDP. The filter includes an external light shield having a first base unit and first pattern units. The first pattern units have boundaries defined by intersections of the first pattern units and the first base unit. The first pattern units absorb external light from the viewer side and are substantially parallel to a first axis. The first axis intersects a longitudinal axis of the external light shield.

An electromagnetic interference (EMI) shield overlaps the external light shield. The EMI shield includes a second base unit and second pattern units. The second pattern units are conductive and substantially parallel to a second axis. The second pattern units have boundaries defined by intersections of the second pattern units and the second base unit. An interior angle between the first axis and the second axis is within a range of 40 to 50 degrees.

Implementations can include one or more of the following features. For example, a refractive index of the first pattern units can be higher than a refractive index of the first base unit. The boundaries of at least one of the first pattern units can define a width of a pattern top disposed toward one of the panel side and the viewer side and can define a width of a pattern bottom disposed toward the other of the panel side and the viewer side, the pattern bottom being wider than the pattern top. A distance between the pattern top and the pattern bottom can define a first pattern height, and a thickness of the external light shield can be 1.01-2.25 times greater than the first pattern height.

A distance between a pair of adjacent first pattern units can be 1.1 to 5 times greater than the width of the pattern bottom. A distance between the pattern top and the pattern bottom can define a first pattern height. The first pattern height can be 0.89 to 4.25 times greater than a distance between adjacent boundaries, of a pair of adjacent first pattern units, at one of the panel side and the viewer side.

In another general aspect, a display apparatus comprises a plasma display panel (PDP) having a display surface. The display apparatus further comprises a filter having a panel side facing the display surface of the PDP and an opposing viewer side facing away from the display surface of the PDP.

The filter includes an external light shield having a first base unit and first pattern units. The first pattern units have boundaries defined by intersections of the first pattern units and the first base unit. The first pattern units absorb external light from the viewer side and are substantially parallel to a first axis. The first axis intersects a longitudinal axis of the external light shield.

An electromagnetic interference (EMI) shield overlaps the external light shield. The EMI shield includes a second base unit, second pattern units substantially parallel to a second axis and having boundaries defined by intersections of the second pattern units and the second base unit, and third pattern units substantially parallel to a third axis and having boundaries defined by intersections of the third pattern units and the second base unit. The second and third pattern units are conductive and intersect in a mesh configuration. The second axis is more aligned with the first axis relative to an alignment of the third axis with the first axis. An interior angle between the first axis and the second axis is within a range of 20 to 60 degrees.

Implementations can include one or more of the following features. For example, the interior angle between the first axis and the second axis can be within a range of 27 to 53 degrees. The interior angle between the first axis and the second axis can be within a range of 27.5 to 52.5 degrees.

The mesh configuration can include: an interior angle between the second axis and a longitudinal axis of the EMI shield within a range of 25 to 60 degrees, an interior angle between the third axis and the longitudinal axis of the EMI shield within a range of 27.5 to 60 degrees, and an exterior angle between the second axis and the third axis within a range of 60 to 127.5 degrees.

In another general aspect, a display apparatus comprises a plasma display panel (PDP) having a display surface. The display apparatus further comprises a filter having a panel side facing the display surface of the PDP and an opposing viewer side facing away from the display surface of the PDP. The filter includes an external light shield having a first base unit and first pattern units. The first pattern units have boundaries defined by intersections of the first pattern units and the first base unit. The first pattern units absorb external light from the viewer side and are substantially parallel to a first axis. The first axis intersects a longitudinal axis of the external light shield.

An electromagnetic interference (EMI) shield overlaps the external light shield. The EMI shield includes a second base unit, second pattern units substantially parallel to a second axis and having boundaries defined by intersections of the second pattern units and the second base unit, and third pattern units substantially parallel to a third axis and having boundaries defined by intersections of the third pattern units and the second base unit. The second and third pattern units are conductive and intersect in a mesh configuration. The second axis is more aligned with the first axis relative to an alignment of the third axis with the first axis. An interior angle between the first axis and the third axis is within a range of 28 to 65 degrees.

Implementations can include one or more of the following features. For example, the interior angle between the first axis and the third axis can be within a range of 33 to 58 degrees. The interior angle between the first axis and the third axis can be within a range of 40 to 50 degrees. The interior angle between the first axis and the third axis can be within a range of 30 to 62.5 degrees. The interior angle between the first axis and the third axis can be within a range of 35 to 57.5 degrees.

The mesh configuration can include: an interior angle between the second axis and a longitudinal axis of the EMI shield within a range of 25 to 60 degrees, an interior angle between the third axis and the longitudinal axis of the EMI shield within a range of 27.5 to 60 degrees, and an exterior angle between the second axis and the third axis within a range of 60 to 127.5 degrees.

In some implementations, a refractive index of the first pattern units is higher than a refractive index of the first base unit.

Other features and advantages will be apparent from the following description and the claims.

DETAILED DESCRIPTION

In some implementations, a plasma display device can improve the bright room contrast and the luminance of a plasma display panel (PDP) by effectively shielding external light incident upon the PDP. In at least one implementation, the plasma display device can reduce the probability of occurrence or perception of a moire phenomenon.

Figure 1:
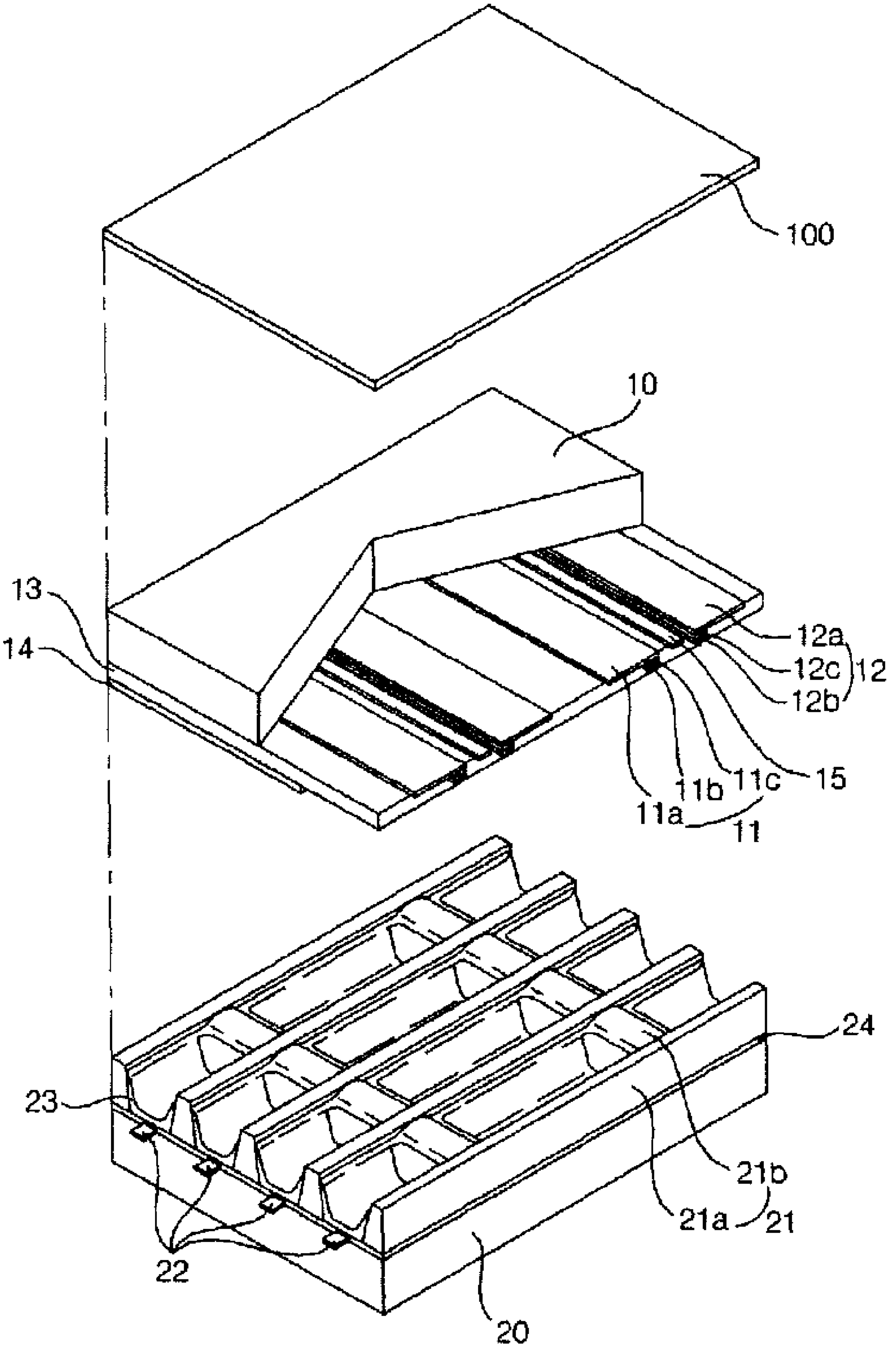
FIG. 1 is a perspective view of an example plasma display panel (PDP).

FIG. 1 is a perspective view illustrating an implementation of a PDP. As shown in FIG. 1, the PDP includes an upper substrate 10 and a plurality of electrode pairs formed on the upper substrate 10, each electrode pair including a scan electrode 11 and a sustain electrode 12. The PDP of FIG. 1 also includes a lower substrate 20 and a plurality of address electrodes 22 that are formed on the lower substrate 20.

Each electrode pair 11 and 12 includes transparent electrodes 11*a* and 12*a* and bus electrodes 11*b* and 12*b*. The transparent electrodes 11*a* and 12*a* may be made of indium-tin-oxide (ITO). The bus electrodes 11*b* and 12*b* may be made of a metal such as silver (Ag) or chromium (Cr) or may be made with a stack of chromium/copper/chromium (Cr/Cu/

Cr) or a stack of chromium/aluminium/chromium (Cr/Al/Cr). The bus electrodes 11*b* and 12*b* are respectively formed on the transparent electrodes 11*a* and 12*a* and reduce a voltage drop caused by the transparent electrodes 11*a* and 12*a*, which have high resistance.

In some implementations, each electrode pair 11 and 12 may be comprised of the bus electrodes 11*b* and 12*b* only. In this case, the manufacturing cost of the PDP can be reduced by omitting the transparent electrodes 11*a* and 12*a*. The bus electrodes 11*b* and 12*b* may be formed of various materials, e.g., a photosensitive material, in addition to those described above.

Black matrices can be formed on the upper substrate 10. The black matrices perform a light shied function by absorbing external light incident upon the upper substrate 10 so that light reflection can be reduced. In addition, the black matrices can enhance the purity and contrast of the upper substrate 10.

In detail, the black matrices can include a first black matrix (BM) 15, which overlaps a plurality of barrier ribs 21, a second black matrix 11*c*, which is formed between the transparent electrode 11*a* and the bus electrode 11*b* of each of the scan electrodes 11, and a second black matrix 12*c*, which is formed between the transparent electrode 12*a* and the bus electrode 12*b*. The first black matrix 15 and the second black matrices 11*c* and 12*c*, which can also be referred to as black layers or black electrode layers, may be formed at the same time and may be physically connected. Alternatively, the first black matrix 15 and the second black matrices 11*c* and 12*c* may not be formed at the same time and may not be physically connected.

If the first black matrix 15 and the second black matrices 11*c* and 12*c* are physically connected, the first black matrix 15 and the second black matrices 11*c* and 12*c* may be formed of the same material. On the other hand, if the first black matrix 15 and the second black matrices 11*c* and 12*c* are physically separated, the first black matrix 15 and the second black matrices 11*e* and 12*c* may be formed of different materials.

The bus electrodes 11*b* and 12*b* or the barrier ribs 21 may have a dark color and may thus serve the functions of the black matrices, e.g., a light shield function and a contrast enhancement function. Alternatively, it is possible for one or more components to operate as or to achieve results earlier attributed to the black matrices. For example, a first element (for example, the dielectric layer 13) on the upper substrate 10 and a second element (for example, the barrier ribs) on the lower substrate 20 may have complementary colors so that the overlapping area of the first and second elements can appear black as viewed from the front of the PDP. In this case, the overlapping area of the first and second elements may serve the functions of the black matrices.

An upper dielectric layer 13 and a passivation layer 14 (or a protective film) are deposited on the upper substrate 10 on which the scan electrodes 11 and the sustain electrodes 12 are formed in parallel with one other. Charged particles generated as a result of a discharge accumulate in the upper dielectric layer 13. The upper dielectric layer 13 may protect the electrode pairs. The passivation layer 14 protects the upper dielectric layer 13 from sputtering of the charged particles and enhances the discharge of secondary electrons.

The address electrodes 22 intersect the scan electrodes 11 and the sustain electrodes 12. A lower dielectric layer 24 and the barrier ribs 21 are formed on the lower substrate 20 on which the address electrodes 22 are formed.

A phosphor layer 23 is formed on the lower dielectric layer 24 and the barrier ribs 21. The barrier ribs 21 include a plurality of vertical barrier ribs 21*a* and a plurality of horizontal barrier ribs 21*b* that form a closed-type barrier rib structure. The barrier ribs 21 define a plurality of discharge cells and prevent ultraviolet (UV) rays and visible rays generated by a discharge in one cell from leaking into adjacent discharge cells.

Referring to FIG. 1, a filter 100 may be disposed at the front of the PDP. The filter 100 may include an external light shield sheet, an anti-reflection (AR) sheet, a near infrared (NIR) shield sheet, an electromagnetic interference (EMI) shield sheet, a diffusion sheet, and an optical sheet.

If the distance between the filter 100 and the PDP is 10-30 μm, the filter 100 can effectively shield external light incident upon the PDP and can emit light (hereinafter referred to as panel light) generated by the PDP. In order to protect the PDP against external impact such as pressure, the distance between the filter 100 and the PDP may be 30-120 μm. An adhesive layer, which can absorb impact, may be disposed between the filter 100 and the PDP in order to further protect the PDP against external impact.

Various barrier rib structures can be used other than those mentioned herein. Example structures include a differential-type barrier rib structure in which the height of vertical barrier ribs 21*a* is different from the height of horizontal barrier ribs 21*b*, a channel-type barrier rib structure in which a channel that can be used as an exhaust passage is formed in at least one vertical or horizontal barrier rib 21*a* or 21*b*, and a hollow-type barrier rib structure in which a hollow is formed in at least one vertical or horizontal barrier rib 21*a* or 21*b*. In the differential-type barrier rib structure, the height of horizontal barrier ribs 21*b* may be greater than the height of vertical barrier ribs 21*a*. In the channel-type barrier rib structure or the hollow-type barrier rib structure, a channel or a hollow cavity may be formed in at least one horizontal barrier rib 21*b*.

In some implementations, red (R), green (G), and blue (B) discharge cells may be arranged in a straight line. This is an example only, and the discharge cells may be arranged in other ways. For example, R, G, and B discharge cells may be arranged as a triangle or a delta-type shape. Alternatively, R, G, and B discharge cells may be arranged as a polygon such as a rectangle, a pentagon, or a hexagon.

The phosphor layer 23 is excited by UV rays that are generated upon a gas discharge. As a result, the phosphor layer 23 generates one of R, G, and B rays. A discharge space is provided between the upper and lower substrates 10 and 20 and the barrier ribs 21. A mixture of inert gases, e.g., a mixture of helium (He) and xenon (Xe), a mixture of neon (Ne) and Xe, or a mixture of He, Ne, and Xe is injected into the discharge space.

Figure 2:
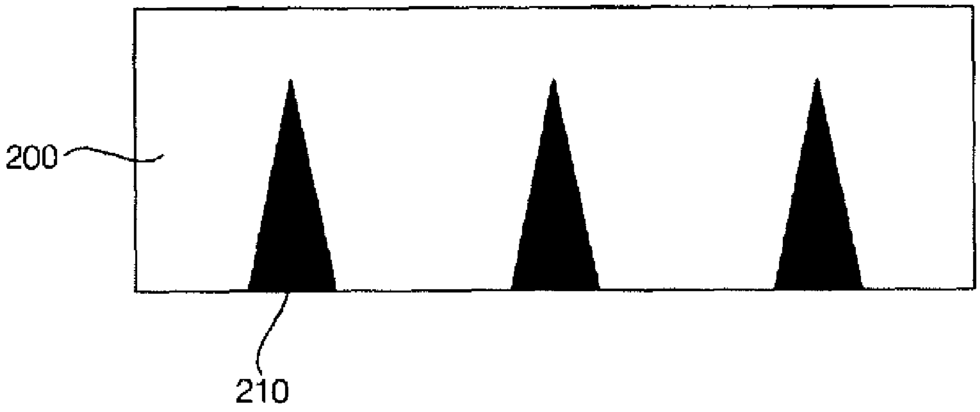
FIG. 2 is a cross-sectional view of an example external light shield sheet.

FIG. 2 is a cross-sectional view of an external light shield sheet that can be included in a filter. Referring to FIG. 2, the external light shield sheet includes a base unit 200 and a plurality of pattern units 210.

The base unit 200 may be formed of a transparent plastic material, e.g., a UV-hardened resin-based material, enabling light to smoothly transmit therethrough. Alternatively, the base unit 200 may be formed of a rigid material such as glass in order to enhance the protection of an entire surface of a PDP.

Referring to FIG. 2, the pattern units 210 may be triangular (e.g., a triangular-prism-type shape). The pattern units 210 may be formed in various other suitable shapes, other than a triangular shape. The pattern units 210 may be formed of a darker material than the base unit 200. In particular, the pattern units 210 may be formed of a black material. For example, the pattern units 210 may be formed of a carbon-based material or may be dyed black so that the absorption of external light can be increased.

The pattern units 210 can have boundaries (e.g., surfaces) defined by intersections (e.g., where the pattern units 210 interface the base unit 200) of the pattern units 210 and the base unit 200. The boundaries of the pattern units can define the widths of pattern tops and the widths of pattern bottoms. For example, two boundary surfaces of a pattern unit can define a pattern top and a pattern bottom. Each of the boundary surfaces of the pattern unit can define an edge of the pattern top and the pattern bottom defined between the two surfaces. The pattern tops can be disposed toward one of the panel side and the viewer side, the pattern bottoms can be disposed toward the other of the panel side and the viewer side.

The boundaries of the pattern units can be sloped, and the pattern bottoms can be wider than the pattern tops. Whichever of an upper side and a lower side of each of the pattern units 210 is wider than the other will hereinafter be referred to as the bottom of a corresponding pattern unit 210.

Referring to FIG. 2, the bottoms of the pattern units 210 may face a PDP side (e.g., a side facing a display surface of the PDP), and the tops of the pattern units 210 may face a viewer on the opposite side of the PDP (e.g., a side facing away from the PDP display surface). Alternatively, the bottoms of the pattern units 210 may face a viewer, and the tops of the pattern units 210 may face a PDP.

In general, an external light source is located above a PDP and therefore external light is highly likely to be diagonally incident upon a PDP from above within a predetermined angle range. At least partially because the external light is diagonally incident, it can be absorbed in the pattern units 210.

Each of the pattern units 210 may contain light absorption particles. The light absorption particles may be stained resin particles. In order to improve the absorption of light, the light absorption particles may be stained a specific color, such as black.

The light absorption particles may have a size of 1 μm or more. In this case, it is possible to facilitate the manufacture of the light absorption particles and the insertion of the light absorption particles into the pattern units 210 and to increase the absorption of external light. If the light absorption particles have a size of 1 μm or more, each of the pattern units 210 may contain 10% or more of the light absorption particles, by weight. In this fashion, it is possible to effectively absorb external light refracted into the pattern units 210.

FIGS. 3 through 6 illustrate external light shield sheets and illustrate optical characteristics of the external light shield sheets.

Figure 3:
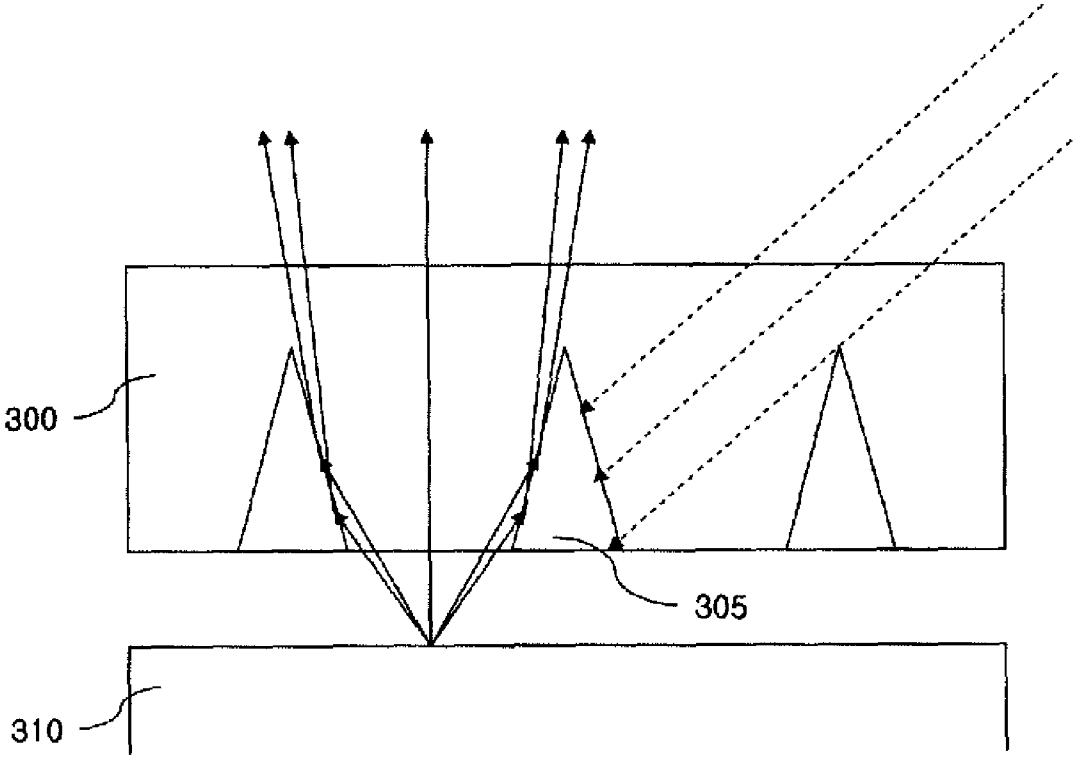
FIGS. 3 through 6 are cross-sectional views of external light shield sheets and illustrate optical characteristics of external light shield sheets.

More specifically, FIG. 3 illustrates the situation in which the tops of a plurality of pattern units 305 face toward a user and the refractive index of the pattern units 305, and particularly, the refractive index of slanted surfaces of the pattern units 305, is lower than the refractive index of a base unit 300 so as to absorb and shield external light and to enhance the reflection of panel light through the reflection of visual rays. As described above, external light which reduces the bright room contrast of a PDP is highly likely to be incident upon a PDP from above. Referring to FIG. 3, according to Snell's law, external light that is diagonally incident upon an external light shield sheet, as indicated by dotted lines, is refracted into and absorbed by the pattern units 305 which have a lower refractive index than the base unit 300. External light refracted into the pattern units 305 may be absorbed by light absorption particles in the pattern units 305.

Also, panel light for displaying an image is reflected toward a user by the slanted surfaces of the pattern units 305, as indicated by solid lines. More specifically, since the angle between panel light and the slanted surfaces of the pattern units 305 is greater than the angle between external light and the slanted surfaces of the pattern units 305, external light is refracted into and absorbed by the pattern units 305, whereas panel light is reflected by the pattern units 305.

The external light shield sheet of FIG. 3 can absorb external light so that external light can be prevented from being reflected toward a user. Also, the external light shield sheet of FIG. 3 can enhance the reflection of light emitted from a PDP 310, increasing the bright room contrast of images displayed by the PDP 310.

In order to increase the absorption of external light and the reflection of light emitted from the PDP 310, the refractive index of the pattern units 305 may be configured to be 0.3-1.0 times higher than the refractive index of the base unit 300 in consideration of the incidence angle of external light with respect to the panel 310. In particular, in order to increase the reflection of panel light by the slanted surfaces of the pattern units 305, the refractive index of the pattern units 305 may be 0.3-0.8 times higher than the refractive index of the base unit 300 in consideration of a vertical viewing angle of the PDP 310.

When the refractive index of the pattern units 305 is lower than the refractive index of the base 300, light emitted from the PDP 310 is reflected by the slanted surfaces of the pattern units 305 and thus spreads out toward the user, thereby resulting in unclear, blurry images, i.e., a ghost phenomenon.

Figure 4:
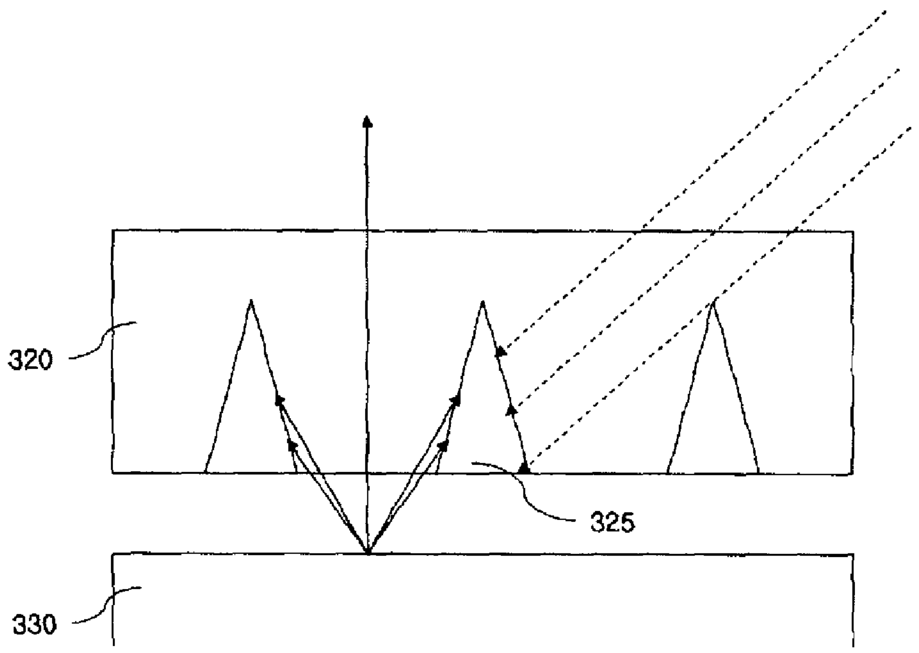

FIG. 4 illustrates the situation in which the tops of a plurality of pattern units 325 faces toward a user and the refractive index of the pattern units 325 is higher than the refractive index of a base unit 320. Referring to FIG. 4, when the refractive index of the pattern units 325 is higher than the refractive index of the base unit 320, external light incident upon the pattern units 325 and light emitted from a PDP 330 are both absorbed by the pattern units 325.

Therefore, it is possible to reduce the probability of occurrence or perception of the ghost phenomenon. In order to absorb as much panel light as possible and thus to prevent the ghost phenomenon, the refractive index of the pattern units 325 may be 0.05 or more higher than the refractive index of the base unit 320.

When the refractive index of the pattern units 325 is higher than the refractive index of the base unit 320, the transmissivity and bright room contrast of an external light shield sheet may decrease. In order not to considerably reduce the transmissivity of an external light shield sheet while preventing the ghost phenomenon, the refractive index of the pattern units 325 may be 0.05-0.3 higher than the refractive index of the base unit 320. Also, in order to uniformly maintain the bright room contrast of the PDP 330 while preventing the ghost phenomenon, the refractive index of the pattern units 325 may be 1.0-1.3 times greater than the refractive index of the base unit 320.

Figure 5:
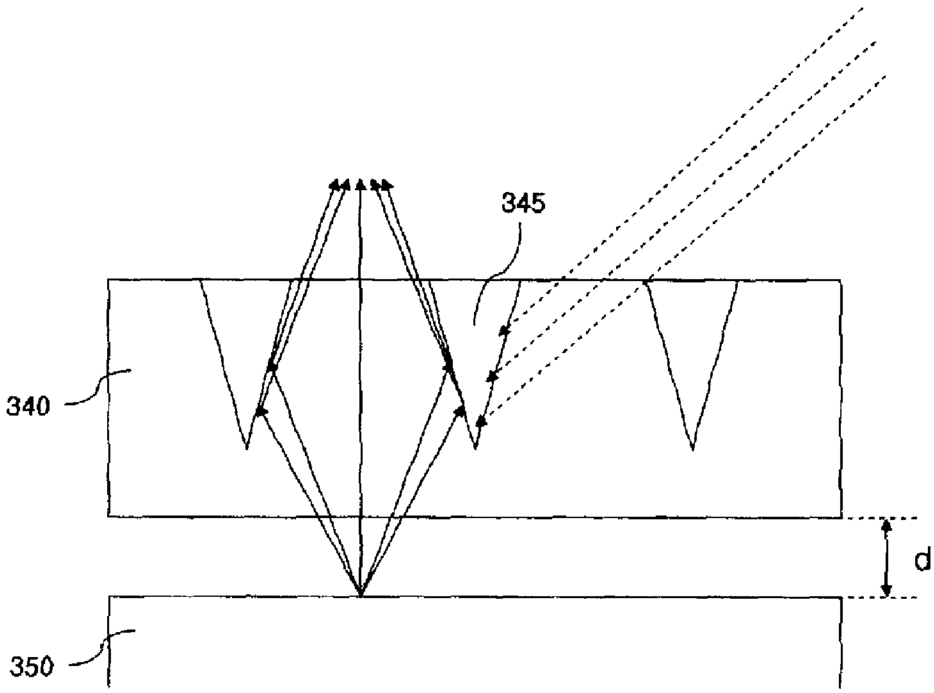

FIG. 5 illustrates the situation in which the bottoms of a plurality of pattern units 345 face toward a user and the refractive index of the pattern units 345 is lower than the refractive index of a base unit 340. Referring to FIG. 5, external light is absorbed by the bottoms of the pattern units 345, thereby enhancing the shielding of external light. The distance between a pair of adjacent pattern units 345 may be widened compared to the distance between a pair of adjacent pattern units 325 illustrated in FIG. 4. Therefore, it is possible to enhance the aperture (or opening) ratio of an external light shield sheet.

According to the implementation shown in FIG. 5, panel light emitted from a PDP 350 is reflected by the slanted surfaces of the pattern units 345 and is thus concentrated together with panel light that directly transmits through the base unit 340 without being reflected by the slanted surfaces of the pattern units 345. Therefore, it is possible to reduce the probability of occurrence or perception of the ghost phenomenon.

In order to further prevent the ghost phenomenon, a distance d between the PDP 350 and an external light shield sheet may be 1.5-3.5 mm.

Figure 6:
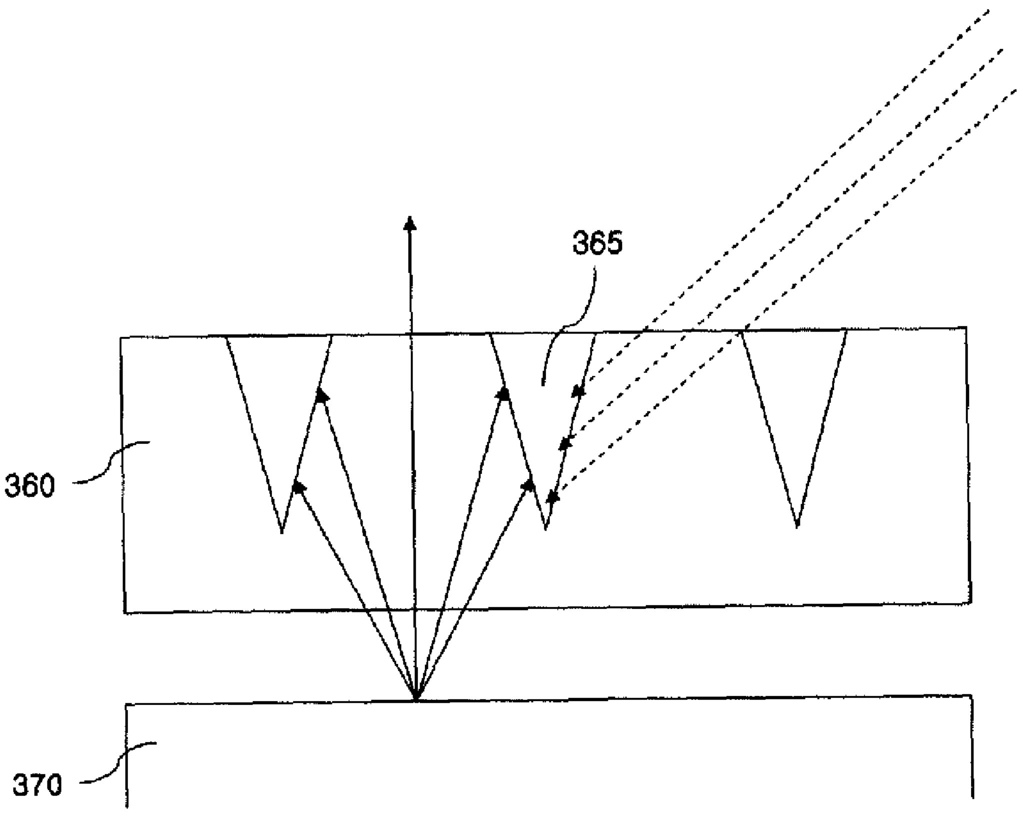

FIG. 6 illustrates the situation in which the bottoms of a plurality of pattern units 365 face toward a user and the refractive index of the pattern units 365 is higher than the refractive index of a base unit 360. Referring to FIG. 6, when the refractive index of the pattern units 365 is higher than the refractive index of the base unit 360, panel light incident upon the slanted surfaces of the pattern units 365 is likely to be absorbed by the pattern units 365. Accordingly, images are displayed only by panel light that transmits through the base unit 360. Thus, it is possible to reduce the probability of occurrence or perception of the ghost phenomenon.

Also, since the refractive index of the pattern units 365 is higher than the refractive index of the base unit 360, it is possible to enhance the absorption of external light.

Figure 7:
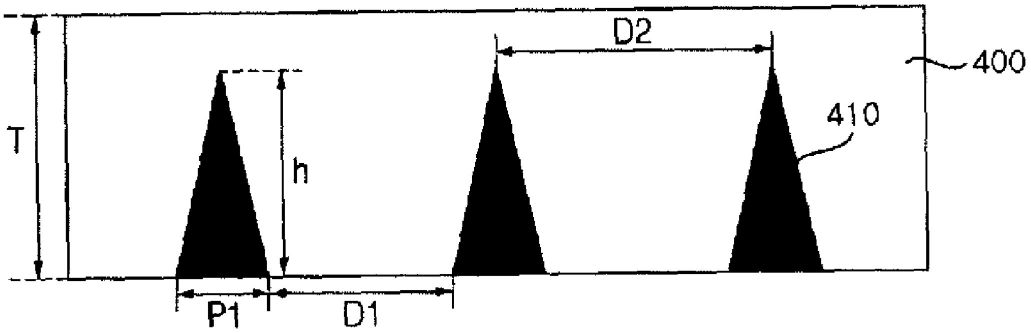
FIG. 7 is a cross-sectional view of example pattern units of an external light shield sheet.

FIG. 7 is a cross-sectional view of an external light shield sheet. Referring to FIG. 7, when a thickness T of an external light shield sheet is 20-250 μm, it is possible to facilitate the manufacture of an external light shield sheet and provide an external light shield sheet with an increased transmissivity. More specifically, the thickness T may be set to be 100-180 μm. In this case, it is possible to effectively absorb and shield external light using a plurality of pattern units 410 and to ensure the durability of an external light shield sheet.

Referring to FIG. 7, the pattern units 410 are formed in a base unit 400 as triangles, particularly, equilateral triangles. A bottom width P1 of the pattern units 410 may be 18-36 μm. In this case, it is possible to secure a sufficient aperture ratio to properly emit panel light toward a user and increase the absorption of external light.

A height h of the pattern units 410 may be 80-170 μm. The slopes of the slanted surfaces of the pattern units 410 may be determined in consideration of the bottom width P1 and the height h so that the absorption of external light and the reflection of panel light can be increased, and that the pattern units 410 can be prevented from being short-circuited.

A distance D1 between adjacent boundaries of a pair of adjacent pattern units 410 at adjacent pattern bottoms may be 40-90 μm, and a distance D2 between the adjacent boundaries of the pair of adjacent pattern units 410 at adjacent pattern bottoms may be 90-130 μm. In this case, it is possible to achieve a sufficient aperture ratio to display images with increased luminance through the emission of panel light toward a user and provide a number of pattern units having slanted surfaces with an optimum slope for enhancing the absorption of external light and the emission of panel light.

The distance D1 may be 1.1-5 times greater than the bottom width P1. In this case, it is possible to secure an optimum aperture ratio for displaying images. In particular, the distance D1 may be 1.5-3.5 times greater than the bottom width P1. In this case, it is possible to optimize the absorption of external light and the emission of panel light.

The height h may be 0.89-4.25 times greater than the distance D1. In this case, it is possible to prevent external light from being incident upon a PDP. In particular, the height h may be 1.5-3 times greater than the distance D1. In this case, it is possible to prevent the pattern units 410 from being short-circuited and to optimize the reflection of panel light.

The distance D2 may be 1.0-3.25 times greater than the distance D1. In this case, it is possible to secure a sufficient aperture ratio to display images with optimum luminance. In particular, the distance D2 may be 1.2-2.5 times greater than the distance D1. In this case, it is possible to optimize the total reflection of panel light by the slanted surfaces of the pattern units 410.

Figure 8:
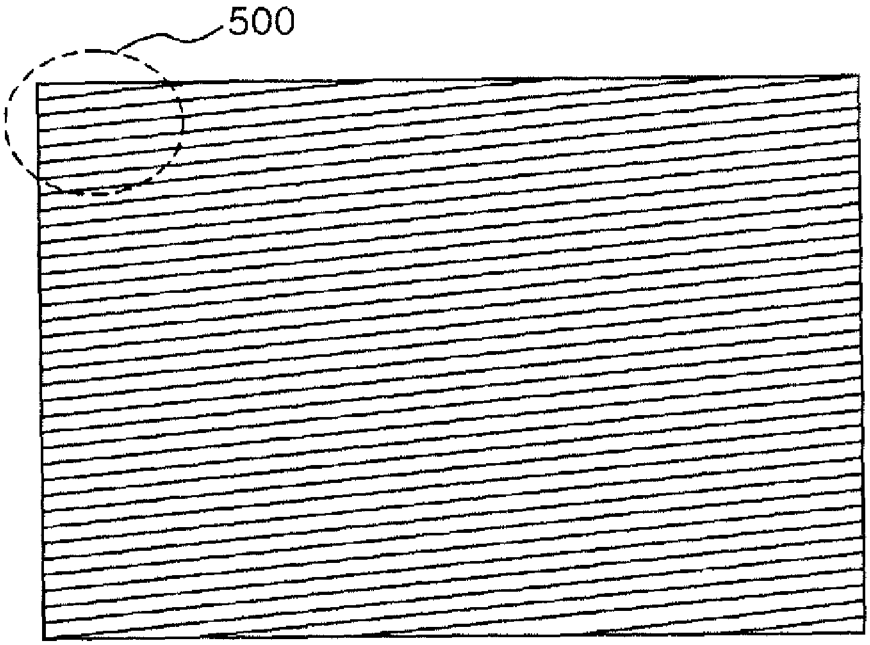
FIGS. 8 and 9 are plan views of example pattern units of an external light shield sheet.
Figure 9:
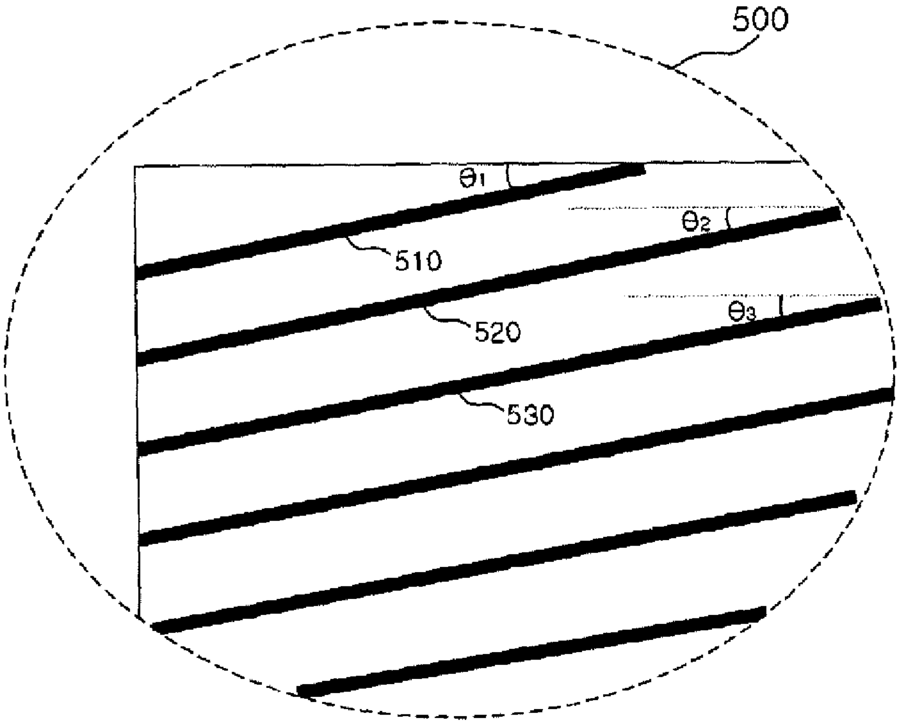

FIGS. 8 and 9 are plan views of a plurality of pattern units of an external light shield sheet. A plurality of pattern units may be formed in a base unit as stripes, and are a predetermined distance apart from each other.

A moire phenomenon may occur when a plurality of pattern units of an external light shield sheet that are a predetermined distance apart from each other overlap black matrices, a black layer, bus electrodes, and barrier ribs that are formed on a PDP. The moire phenomenon refers to low-frequency patterns that are generated by overlapping similar types of grating patterns. For example, when mosquito nets are overlaid each other, ripple patterns appear.

Referring to FIGS. 8 and 9, a plurality of pattern units 510, 520, and 530 are formed diagonally with respect to the lengthwise (longitudinal) direction of an external light shield sheet, thereby reducing the probability of occurrence or user perception of the moire phenomenon. The pattern units 510, 520, and 530 can be substantially parallel to one or more axes that are diagonal with respect to the longitudinal axis of the external light shield and that form one or more angles (e.g., θ1, θ2 and θ3) with the longitudinal axis of the external light shield.

Figure 10A:
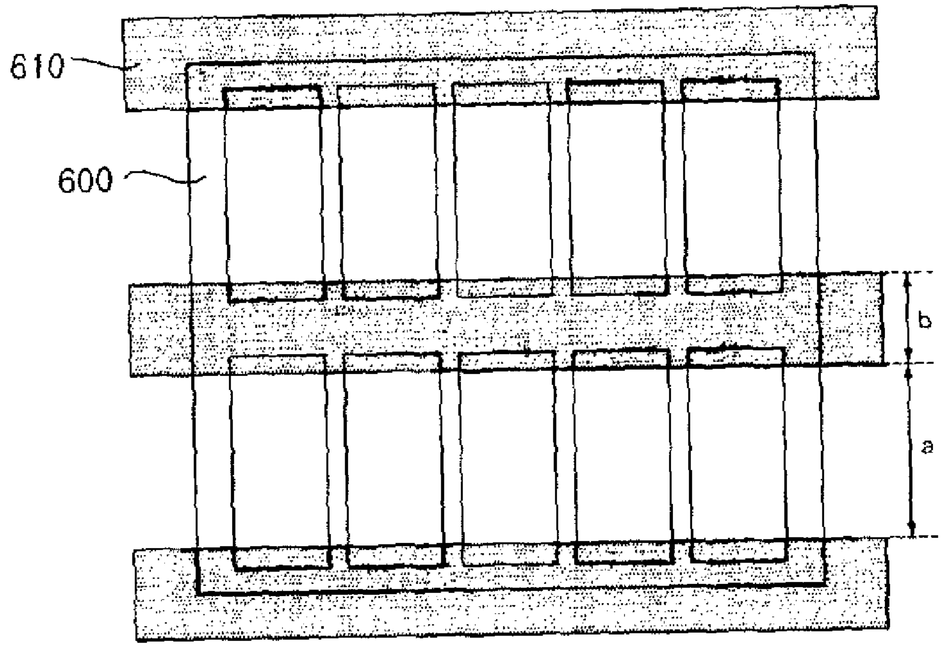
FIGS. 10A and 10B are plan views illustrating structures of black matrices that can be formed on an upper substrate of a PDP.

Referring to FIG. 10A, black matrices 610 are parallel to horizontal barrier ribs which are formed on a lower substrate of a PDP, and are also parallel to an upper side or lower side of the external light shield sheet illustrated in FIGS. 8 and 9. Therefore, angles $\theta_1$, $\theta_2$ and $\theta_3$ between the upper side of the external light shield sheet and the pattern units 510, 520 and 530 are the same as the angles between the pattern units 510, 520 and 530 and black matrices.

A plurality of pattern units of an external light shield sheet may form an angle of 20 degrees or less with black matrices on a PDP, thereby reducing the probability of occurrence or perception of the moire phenomenon. Given that external light is highly likely to be incident upon a PDP from above, the pattern units may form an angle of 5 degrees or less with the black matrices, thereby reducing the probability of occurrence or perception of the moire phenomenon, securing an optimum aperture ratio, increasing the reflection of panel light, and effectively shielding external light.

FIG. 9 is an enlarged view of a portion 500 of the external light shield sheet illustrated in FIG. 8. Referring to FIG. 9, the pattern units 510, 520, and 530 may be parallel to each other. Even if the pattern units 510, 520, and 530 are not parallel to each other, the angles between the pattern units 510, 520 and 530 and black matrices may fall within the above-described range.

As described above, the angles $\theta_1$, $\theta_2$ and $\theta_3$ may be 20 degrees or less. In this case, it is possible to reduce the probability of occurrence or perception of the moire phenomenon. Also, given that external light is highly likely to be incident upon a PDP from above, the angles $\theta_1$, $\theta_2$ and $\theta_3$ may be 5 degrees or less. In this case, it is possible to reduce the probability of occurrence or perception of the moire phenomenon, secure an optimum aperture ratio, increase the reflection of panel light, and effectively shield external light.

Referring to FIGS. 8 and 9, the pattern units 510, 520, and 530 are formed diagonally in a direction from a lower right portion of an external light shield sheet to an upper left portion of the external light shield sheet. Alternatively, the pattern units 510, 520, and 530 may be formed diagonally in a direction from an upper left portion of an external light shield sheet to a lower right portion of the external light shield sheet.

Figure 10B:
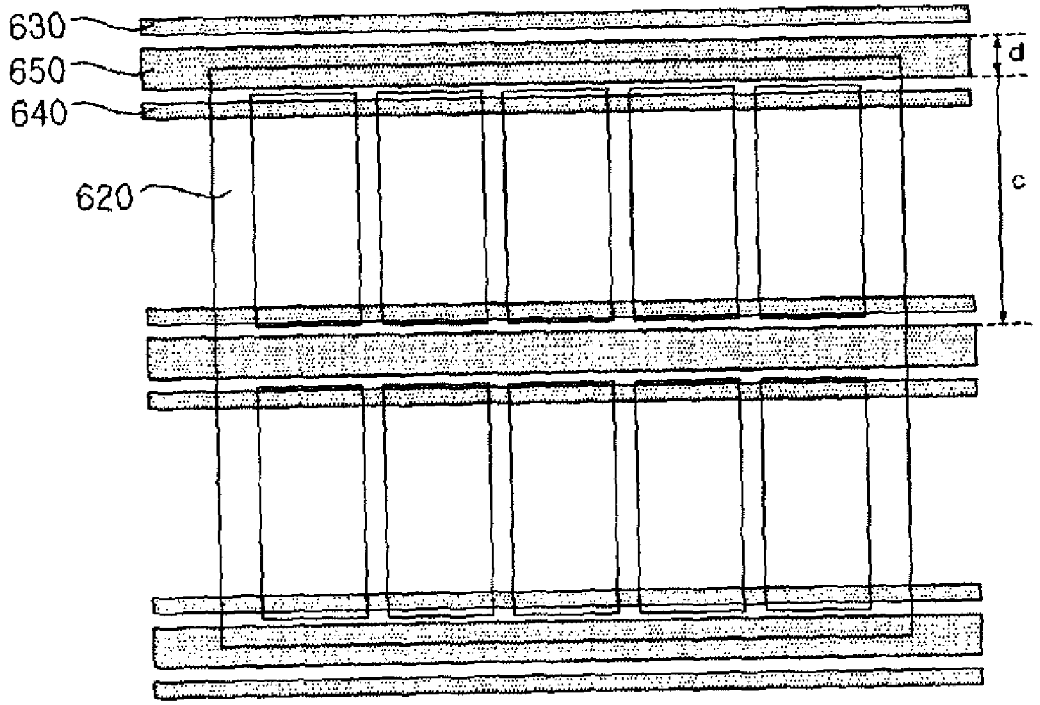

FIGS. 10A and 10B illustrate black matrices that can be formed on a PDP. Referring to FIG. 10A, black matrices 610 may overlap respective corresponding horizontal barrier ribs which are formed on a lower substrate 600. Also, the black matrices 610 may overlap respective corresponding scan electrode-sustain electrode pairs, which are formed on an upper substrate (not shown), so that the scan electrode-sustain electrode pairs can be hidden from view by the black matrices 610.

When a width b of the black matrices 610 is 200-400 μm and a distance a between a pair of adjacent black matrices 610 is 300-600 μm, it is possible to secure an optimum aperture ratio for optimizing the luminance of images displayed by a PDP and to increase the efficiency of shielding external light and the efficiency of enhancing the purity and contrast of an upper substrate.

Referring to FIG. 10B, black matrices 650 may be spaced apart from respective corresponding electrode pairs, each electrode pair comprising a scan electrode 630 and a sustain electrode 640.

A width d of the black matrices 650 is 70-150 μm, and a distance c between a pair of adjacent black matrices 650 is 500-800 μm. In this configuration, it is possible to increase the efficiency of shielding external light and the efficiency of enhancing the purity and contrast of an upper substrate.

As described above, the moire phenomenon may occur when pattern units of an external light shield sheet overlie black matrices on an upper substrate.

When a width of black matrices is 3-15 times greater than the bottom width P1 of pattern units, it is possible to secure an optimum aperture ratio for a PDP and increase the efficiency of shielding external light while reducing the probability of occurrence or perception of the moire phenomenon. Also, when the distance between a pair of adjacent black matrices is 4-12 times greater than the distance D1 between a pair of adjacent pattern units, it is possible to optimize the reflection of panel light and reduce the probability of occurrence or perception of the moire phenomenon by enabling panel light to be reflected through black matrices by the slanted surfaces of pattern units of an external light shield sheet.

When the black matrices 610 overlap respective corresponding scan electrode-sustain electrode pairs, as illustrated in FIG. 10A, the width b of the black matrices 610 may be 10-15 times greater than the bottom width P1 of pattern units of an external light shield sheet. In this case, it is possible to reduce the occurrence or perception of the moire phenomenon, secure an optimum aperture ratio for a PDP, and increase the efficiency of shielding external light. In addition, the distance a between a pair of adjacent black matrices 610 may be 4-9 times greater than the distance between a pair of adjacent pattern units. In this case, it is possible to optimize the reflection of panel light and reduce the probability of occurrence or perception of the moire phenomenon.

When the black matrices 650 are spaced apart from respective corresponding scan electrode-sustain electrode pairs, the distance d of the black matrices 650 may be 3-7 times greater than the bottom width P1 of pattern units of an external light shield sheet. In this case, it is possible to reduce the probability of occurrence or perception of the moire phenomenon, secure an optimum aperture ratio for a PDP, and increase the efficiency of shielding external light. In addition, the distance a between a pair of adjacent black matrices 650 may be 7-12 times greater than the distance between a pair of adjacent pattern units. In this case, it is possible to optimize the reflection of panel light and reduce the probability of occurrence or perception of the moire phenomenon.

Figure 11:
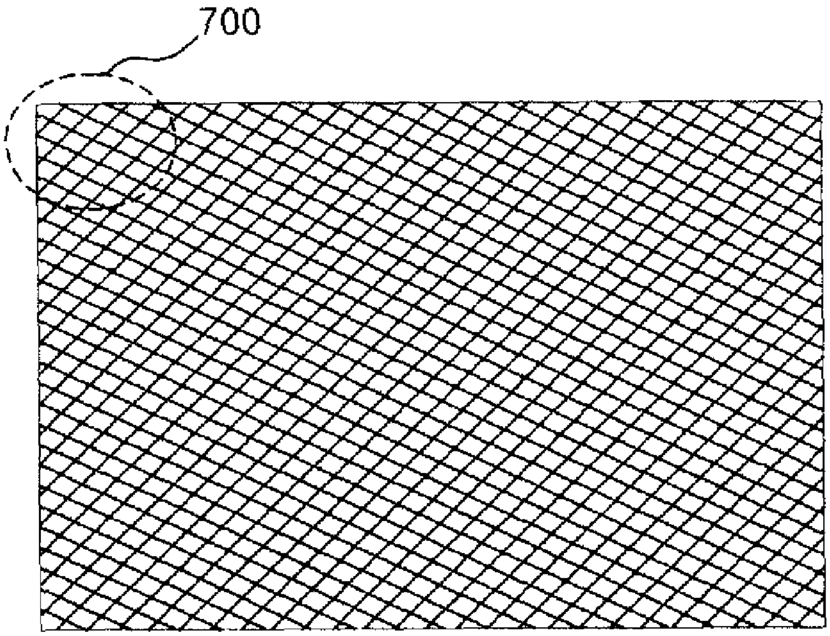
FIGS. 11 and 12 illustrate an example electromagnetic interference (EMI) shield sheet.
Figure 12:
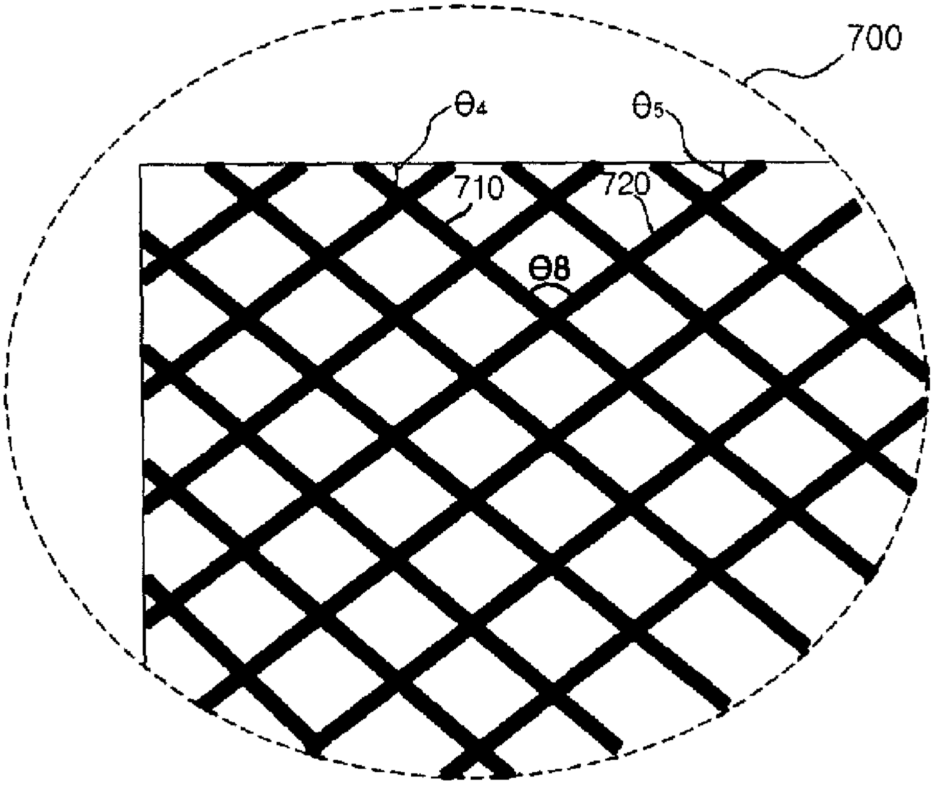

FIGS. 11 and 12 illustrate an example configuration of an EMI shield sheet. Referring to FIGS. 11 and 12, an EMI shield sheet includes a base unit on which a plurality of metallic patterns are disposed as a mesh. The metallic patterns can be formed of a conductive metal, such as copper (Cu). The angles between the metallic patterns and the upper boundary of the EMI shield sheet, i.e., an angle $\theta_5$ and $\theta_4$, are the same as the angles between the metallic patterns and black matrices formed on a PDP.

FIG. 12 is an enlarged view of a portion 700 of the EMI shield sheet illustrated in FIG. 11. Referring to FIG. 12, first mesh patterns 720 are formed in a diagonal direction from upper right to lower left. Second mesh patterns 710 are formed in a diagonal direction from upper left to lower right and cross the first mesh patterns 720. The first mesh patterns 720 form the angle $\theta_5$ with black matrices, and the second mesh patterns 710 form the angle $\theta_4$ with the black matrices. The first mesh patterns 720 form an angle $\theta_8$ with the second mesh patterns 710.

The first mesh patterns 720 can be arranged substantially parallel to an axis running diagonally through upper right to lower left. The angle $\theta_4$ may represent an interior angle between this axis and the longitudinal axis of the EMI shield. The second mesh patterns 710 can be arranged substantially parallel to an axis running diagonally through upper left to lower right. The angle $\theta_5$ may represent an interior angle between this axis and the longitudinal axis of the EMI shield. The angle $\theta_8$ may represent an exterior angle between the respective axes of the first mesh patterns and the second mesh patterns.

The width of the first and second mesh patterns 720 and 710 may be within the range of 5-15 μm. In this case, it is possible to effectively prevent the occurrence or perception of the moire phenomenon, to properly shield EMI, to secure an optimum aperture ratio for a plasma display device, and to maintain an optimum luminance for images displayed by a plasma display device.

In some implementations, the EMI shield sheet illustrated in FIGS. 11 and 12 may be attached to an external light shield sheet of a plasma display device. The structure of an external light shield sheet with an EMI shield sheet attached thereon will be described in detail with reference to FIGS. 13 and 14.

Figure 13:
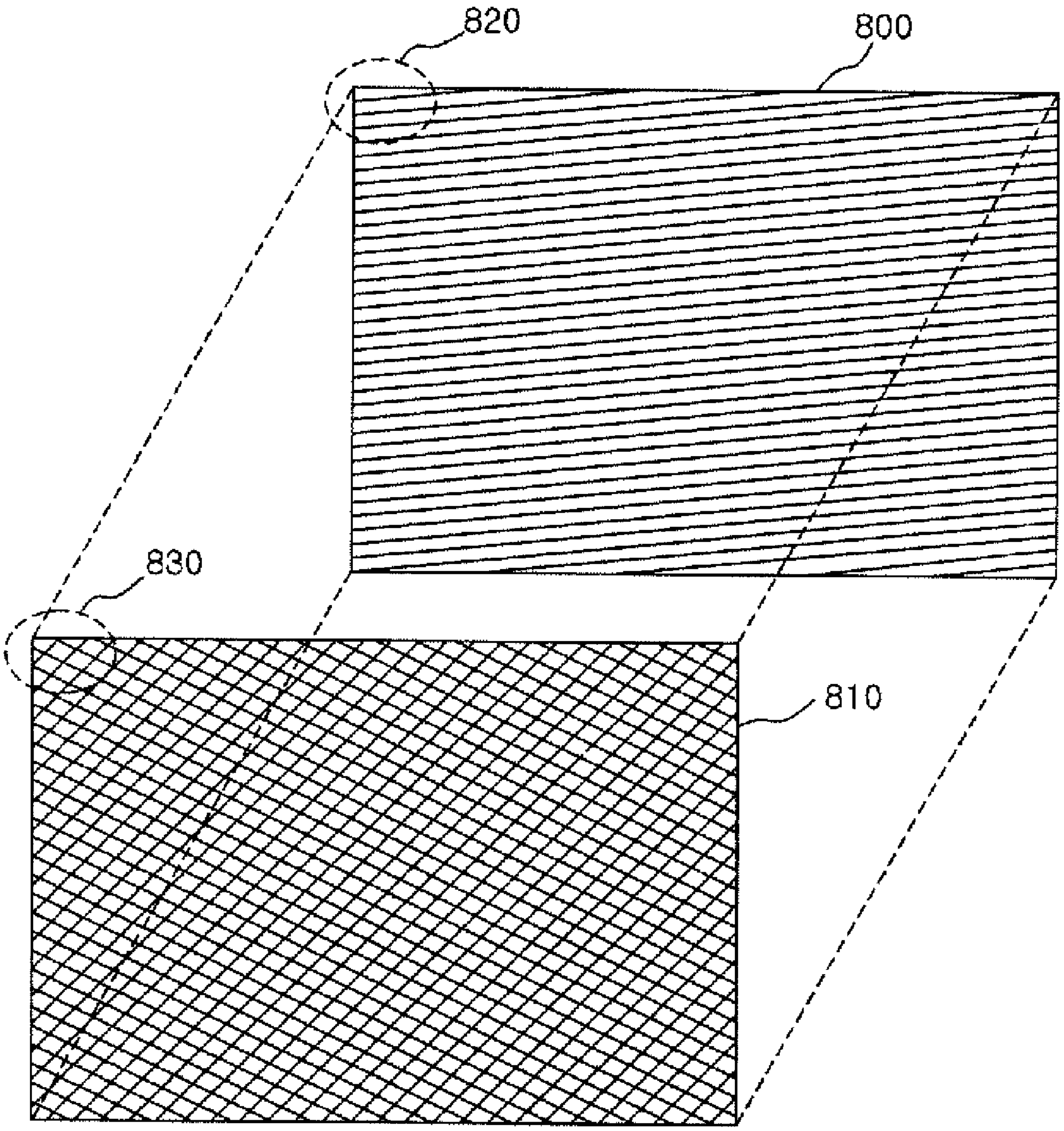
FIGS. 13 and 14 illustrate a filter in which an EMI shield sheet and an external light shield sheet overlap each other.
Figure 14:
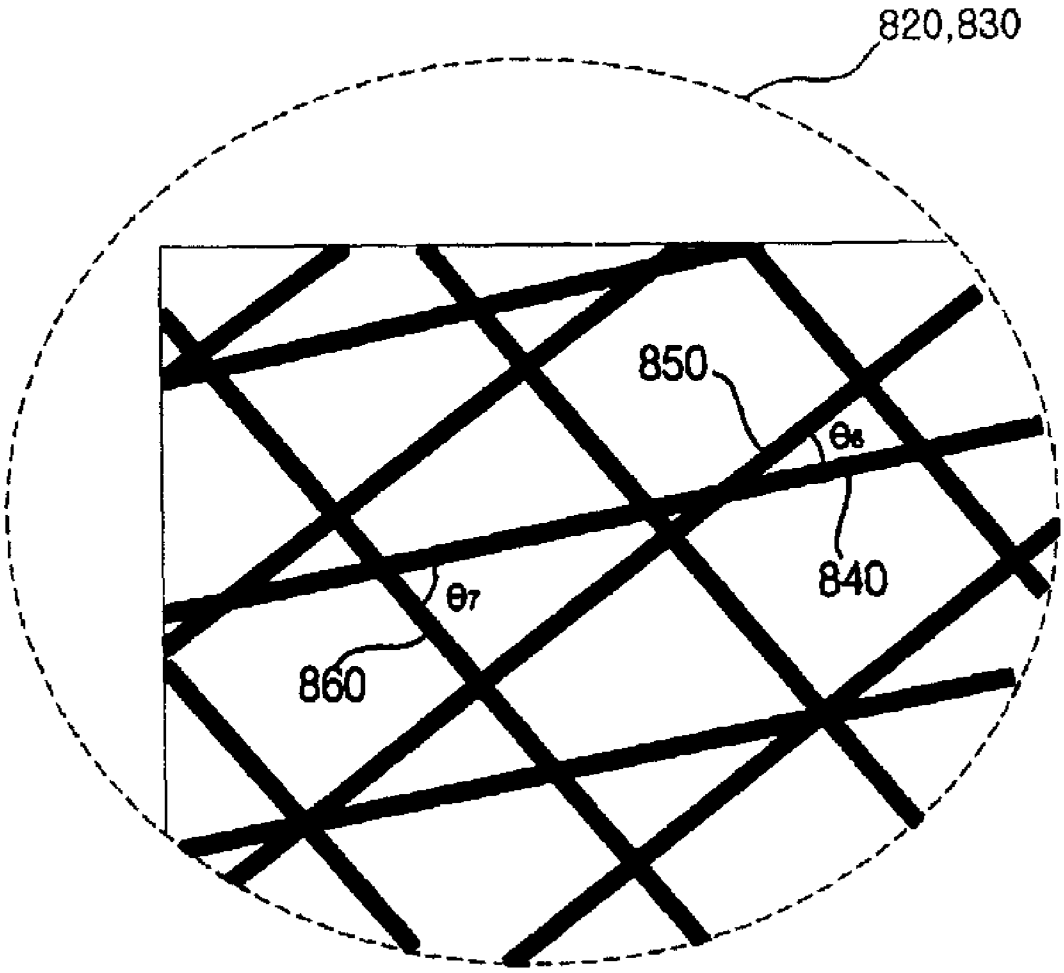

Referring to FIGS. 13 and 14, in order for the EMI shield sheet to effectively shield EMI and reduce the probability of occurrence or perception of the moire phenomenon, the angles between the first mesh patterns 720 and black matrices and between the second mesh patterns 710 and the black matrices, i.e., the angles $\theta_5$ and $\theta_4$, may be within the range of 20 to 60 degrees. In this case, the angle between the first mesh patterns 720 and the second mesh patterns 710, i.e., the angle $\theta_8$, may be within the range of 60-130 degrees.

In order to prevent the moire phenomenon from being caused by patterns diagonally formed on an external light shield sheet, the angles $\theta_5$ and $\theta_4$ may be within the range of 30-55 degrees. In this case, the angle $\theta_8$ may be within the range of 70-118 degrees.

When the angles $\theta_5$ and $\theta_4$ are within the range of 35-45 degrees, it is possible to facilitate the manufacture of the first and second mesh patterns 720 and 710, which intersect each other, and to secure an optimum aperture ratio for a plasma display device.

FIGS. 13 and 14 illustrate an external light shield sheet 800 with an EMI shield sheet 810 attached thereon. The EMI shield sheet 810 may be attached to the external light shield sheet 800 on which a plurality of pattern units 840 are diagonally formed in order to reduce the occurrence or perception of the moire phenomenon.

FIG. 14 illustrates an enlarged view of portions 820 and 830 of the external light shield sheet 800. Referring to FIG. 14, the pattern units 840 overlap first and second mesh patterns 850 and 860 which are formed on the EMI shield sheet 810.

When an angle $\theta_6$ between the pattern units 840 and the first mesh patterns 850 is within the range of 20-60 degrees, the external light shield sheet 800 can effectively shield EMI and reduce the probability of occurrence or perception of the moire phenomenon. In order for the external light shield sheet 800 to shield external light and effectively prevent the moire phenomenon, the angle $\theta_6$ may be within the range of 27-53 degrees. The angle $\theta_6$ may represent an interior angle between respective axes to which the pattern units 840 and the first mesh patterns 850 are substantially parallel.

The angle $\theta_6$ may be within the range of 40-50 degrees, in order to increase the ease of fabrication of the pattern units 840 and the first and second mesh patterns 850 and 860, secure an optimum aperture ratio of a plasma display device and provide wide viewing angles.

When an angle $\theta_7$ between the pattern units 840 and the second mesh patterns 860 is within the range of 28-65 degrees, the external light shield sheet 800 can properly shield EMI and reduce the probability of occurrence or perception of the moire phenomenon. The angle $\theta_7$ may represent an interior angle between respective axes to which the pattern units 840 and the second mesh patterns 860 are substantially parallel.

The angle $\theta_7$ may be within the range of 33-58 degrees, in order for the external light shield sheet 800 to shield external light incident upon a PDP from above and effectively prevent the moire phenomenon.

The angle $\theta_7$ may be within the range of 40-50 degrees, in order to increase the ease of fabrication of the pattern units 840 and the first and second mesh patterns 850 and 860, secure an optimum aperture ratio of a plasma display device and provide wide viewing angles.

Table 1 below presents experimental results obtained by setting an angle $\theta_1$ between the pattern units 840 and black matrices to 2.5 degrees and continuously varying the angles $\theta_4$, $\theta_5$, $\theta_6$, $\theta_7$, and $\theta_8$. Table 1 illustrates the relationships between the occurrence of the moire phenomenon and the angles $\theta_4$, $\theta_5$, $\theta_6$, $\theta_7$, and $\theta_5$.

Referring to Table 1, reference character ○ indicates the situation when the moire phenomenon has occurred, reference character Δ indicates the situation when the probability of occurrence of the moire phenomenon has been reduced to 50% or less, and reference character x indicates the situation when the moire phenomenon has not occurred.

TABLE 1

| $\theta_1$ | $\theta_5$ | $\theta_4$ | Moire | $\theta_8$ | $\theta_6$ | $\theta_7$ |
|---|---|---|---|---|---|---|
| 2.5 | 5 | 5 | ○ | 170 | 2.5 | 7.5 |
| 2.5 | 5 | 7.5 | ○ | 167.5 | 2.5 | 10 |
| 2.5 | 10 | 10 | ○ | 160 | 7.5 | 12.5 |
| 2.5 | 10 | 12.5 | ○ | 157.5 | 7.5 | 15 |
| 2.5 | 15 | 15 | ○ | 150 | 12.5 | 17.5 |
| 2.5 | 15 | 17.5 | ○ | 147.5 | 12.5 | 20 |
| 2.5 | 20 | 20 | ○ | 140 | 17.5 | 22.5 |
| 2.5 | 20 | 22.5 | ○ | 137.5 | 17.5 | 25 |
| 2.5 | 25 | 25 | ○ | 130 | 22.5 | 27.5 |
| 2.5 | 25 | 27.5 | Δ | 127.5 | 22.5 | 30 |
| 2.5 | 30 | 30 | Δ | 120 | 27.5 | 32.5 |
| 2.5 | 30 | 32.5 | x | 117.5 | 27.5 | 35 |
| 2.5 | 35 | 35 | x | 110 | 32.5 | 37.5 |
| 2.5 | 35 | 37.5 | x | 107.5 | 32.5 | 40 |
| 2.5 | 40 | 40 | x | 100 | 37.5 | 42.5 |

TABLE 1-continued

| $\theta_1$ | $\theta_5$ | $\theta_4$ | Moire | $\theta_8$ | $\theta_6$ | $\theta_7$ |
|---|---|---|---|---|---|---|
| 2.5 | 40 | 42.5 | x | 97.5 | 37.5 | 45 |
| 2.5 | 45 | 45 | x | 90 | 42.5 | 47.5 |
| 2.5 | 45 | 47.5 | x | 87.5 | 42.5 | 50 |
| 2.5 | 50 | 50 | x | 80 | 47.5 | 52.5 |
| 2.5 | 50 | 52.5 | x | 77.5 | 47.5 | 55 |
| 2.5 | 55 | 55 | x | 70 | 52.5 | 57.5 |
| 2.5 | 55 | 57.5 | Δ | 67.5 | 52.5 | 60 |
| 2.5 | 60 | 60 | Δ | 60 | 57.5 | 62.5 |
| 2.5 | 60 | 62.5 | ○ | 57.5 | 57.5 | 65 |
| 2.5 | 65 | 65 | ○ | 50 | 62.5 | 67.5 |
| 2.5 | 65 | 67.5 | ○ | 47.5 | 62.5 | 70 |
| 2.5 | 70 | 70 | ○ | 40 | 67.5 | 72.5 |
| 2.5 | 70 | 72.5 | ○ | 37.5 | 67.5 | 75 |
| 2.5 | 75 | 75 | ○ | 30 | 72.5 | 77.5 |
| 2.5 | 75 | 77.5 | ○ | 27.5 | 72.5 | 80 |
| 2.5 | 80 | 80 | ○ | 20 | 77.5 | 82.5 |
| 2.5 | 80 | 82.5 | ○ | 17.5 | 77.5 | 85 |
| 2.5 | 85 | 85 | ○ | 10 | 82.5 | 87.5 |
| 2.5 | 85 | 87.5 | ○ | 7.5 | 82.5 | 90 |
| 2.5 | 90 | 90 | ○ | 0 | 87.5 | 92.5 |

Referring to Table 1, when the angle $\theta_5$ is within the range of 25-60 degrees, the probability of occurrence or perception of the moire phenomenon can be reduced. When the angle $\theta_5$ is within the range of 30-55 degrees, the probability of occurrence or perception of the moire phenomenon can be further reduced. When the angle $\theta_4$ is within the range of 27.5-60 degrees, the probability of occurrence or perception of the moire phenomenon can be reduced. When the angle $\theta_4$ is within the range of 32.5-55 degrees, the probability of occurrence or perception of the moire phenomenon can be further reduced.

When the angle $\theta_8$ is within the range of 60-127.5 degrees, the probability of occurrence or perception of the moire phenomenon can be reduced. When the angle $\theta_8$ is within the range of 70-117.5 degrees, the moire phenomenon can be further reduced.

When the angle $\theta_6$ is within the range of 22.5-57.5 degrees, the moire phenomenon can be reduced. When the angle $\theta_6$ is within the range of 27.5-52.5 degrees, the moire phenomenon can be reduced.

When the angle $\theta_7$ is within the range of 30-62.5 degrees, the moire phenomenon can be reduced. When the angle $\theta_7$ is within the range of 35-57.5 degrees, the moire phenomenon can be further reduced.

FIGS. 15 through 19 are cross-sectional views of external light shield sheets illustrating various shapes of pattern units.

Figure 15:
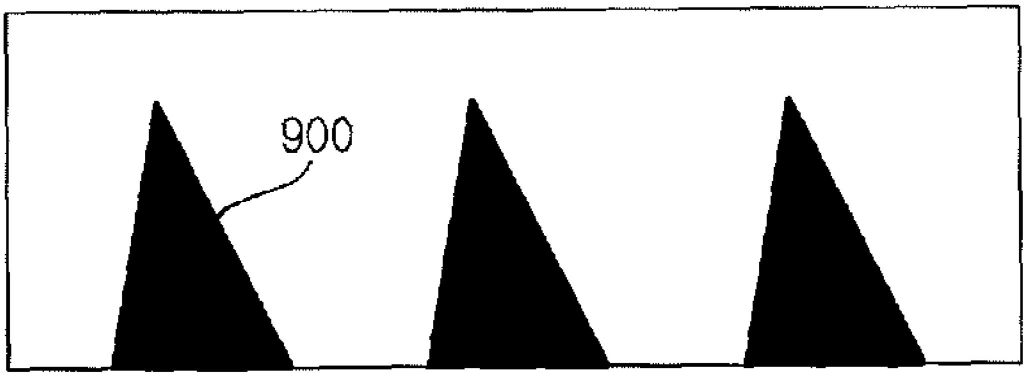
FIG. 15 is a plan view illustrating a structure of bus electrodes that can be formed on an upper substrate of a PDP.

Referring to FIG. 15, a plurality of pattern units 900 may be asymmetrical with respect to their respective horizontal axes. In other words, a pair of slanted surfaces or boundaries of each of the pattern units 900 may have different areas or may form different angles with the bottom of an external light shield sheet. A pair of slanted surfaces of each of the pattern units 900 may have different areas or may form different angles with the bottom of a corresponding pattern unit 900. In general, an external light source is located above a PDP. Thus, external light is highly likely to be incident upon a PDP from above at a certain range of angles. One of a pair of slanted surfaces of each of the pattern units 900 upon which external light is directly incident will hereinafter be referred to as an upper slanted surface, and the other slanted surface will hereinafter be referred to as a lower slanted surface. In order to enhance the absorption of external light and the reflection of light emitted from a PDP, the upper slanted surfaces of the pattern units 900 may be less steep than the lower slanted surfaces of the pattern units 900. That is, the slope of the upper slanted surfaces of the pattern units 900 may be less than the slope of the lower slanted surface of the pattern units 900.

Figure 16:
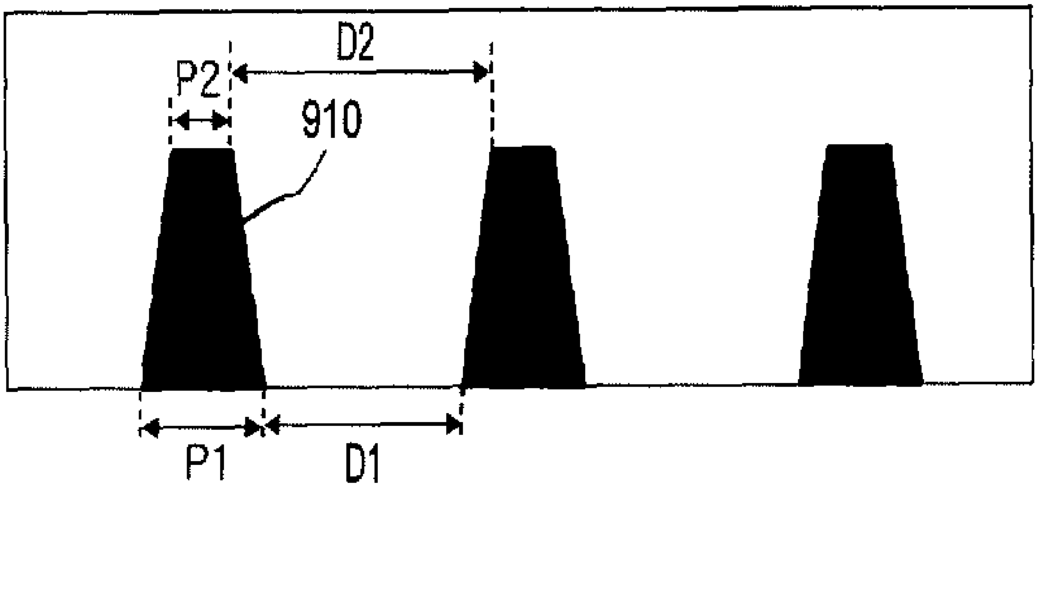
FIGS. 16 and 17 are plan views of various barrier rib structures that can be formed on a lower substrate of a PDP.

Referring to FIG. 16, a plurality of pattern units 910 may be trapezoidal. As illustrated in FIG. 16, a distance D1 between a pair of adjacent boundaries of the pattern units 910 at adjacent pattern bottoms can be less than a distance D2 between the adjacent boundaries at adjacent pattern tops. In FIG. 16, a top width P2 of the pattern units 910 is less than a bottom width P1 of the pattern units 910. The top width P2 may be 10 μm or less. The slope of the slanted surfaces of the pattern units 910 can be appropriately determined according to the relationship between the bottom width P1 and the top width P2 so that the absorption of external light and the reflection of light emitted from a PDP can be increased.

Figure 17:
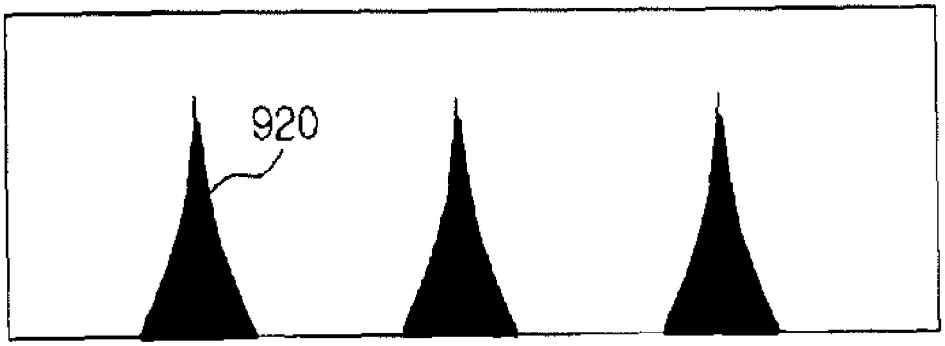
Figure 18:
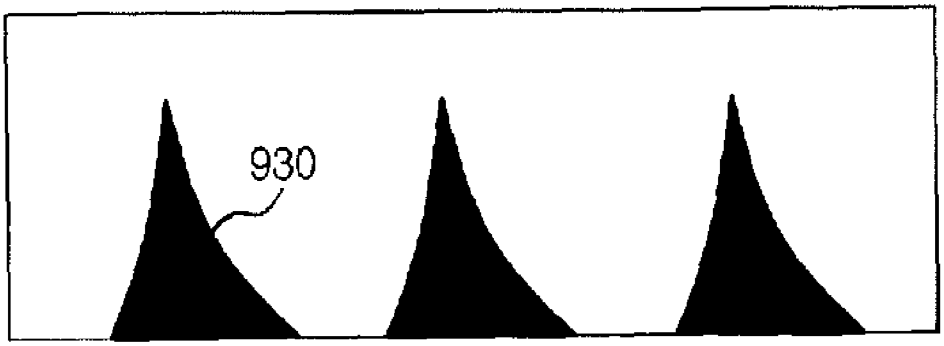
FIGS. 18 and 19 are cross-sectional views of external light shield sheets having pattern units with various shapes.
Figure 19:
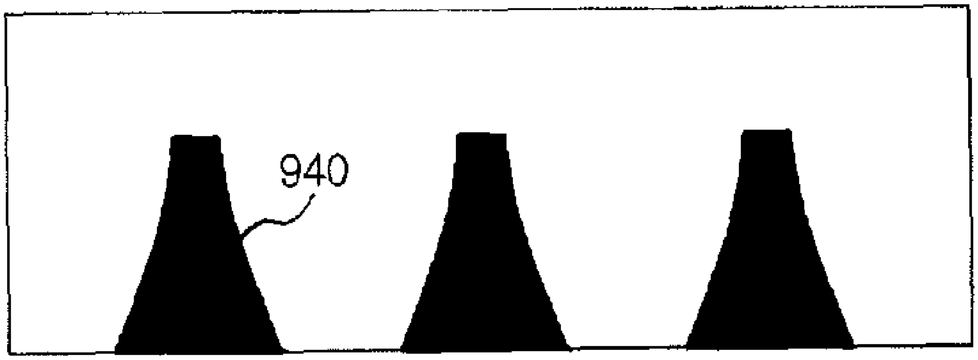

Referring to FIGS. 17 through 19, a pair of slanted surfaces of each of a plurality of pattern units 920, 930, and 940 may have curved lateral surfaces or boundaries with a predetermined curvature. In order to further shield external light diagonally incident upon a PDP, the slope of the slanted surfaces of the pattern units 920, 930, or 940 may lessen (or become more gentle) from the bottoms to the tops of the pattern units 920, 930, or 940.

Each of the pattern units 920, 930, and 940 illustrated in FIGS. 17 through 19 may have curved edges with a predetermined curvature.

Figure 20:
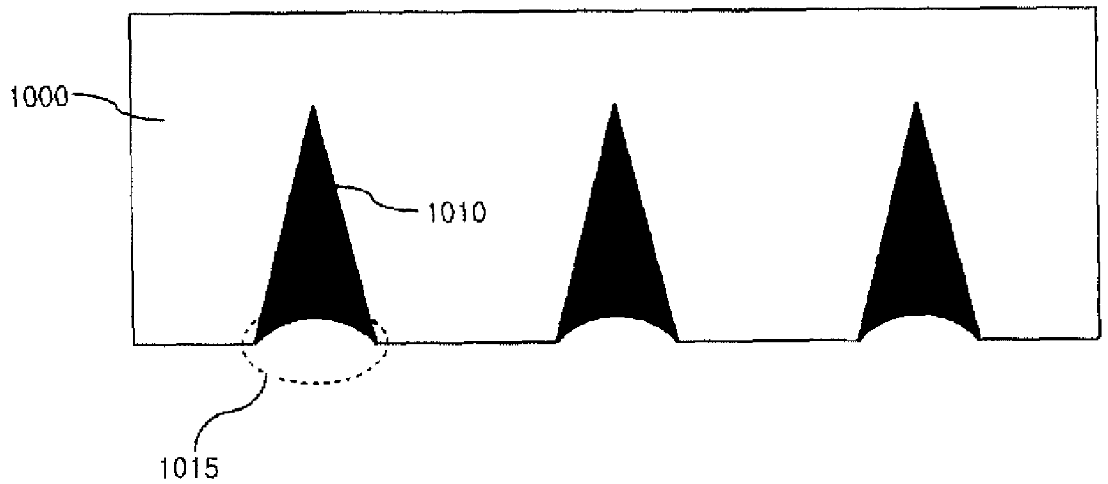
FIGS. 20 through 25 are cross-sectional views of pattern units with recessed bottoms and illustrate optical characteristics of the pattern units.

FIG. 20 is a cross-sectional view of an external light shield sheet including a plurality of pattern units 1010 with recessed (or concave) bottoms. Referring to FIG. 20, the bottoms 1015 of the pattern units 1010 are recessed. Thus, it is possible to reduce image smear caused by panel light reflected from the bottoms 1015 of the pattern units 1010. In addition, since the external light shield sheet illustrated in FIG. 20 has a relatively large surface area, the external light shield sheet can be firmly attached onto another function sheet or a PDP.

The bottoms 1015 of the pattern units 1010 may be recessed so that the height of the pattern units 1010 becomes less at the center of each of the pattern units 1010 than on either side of the bottom 1015 of each of the pattern units 1010.

The pattern units 1010 may be formed by forming a plurality of grooves in a base unit 1000 and filling the grooves—at least partially and, in some implementations, not completely—with a light absorption material so that the bottoms 1015 of the pattern units 1010 can be slightly recessed.

Figure 21:
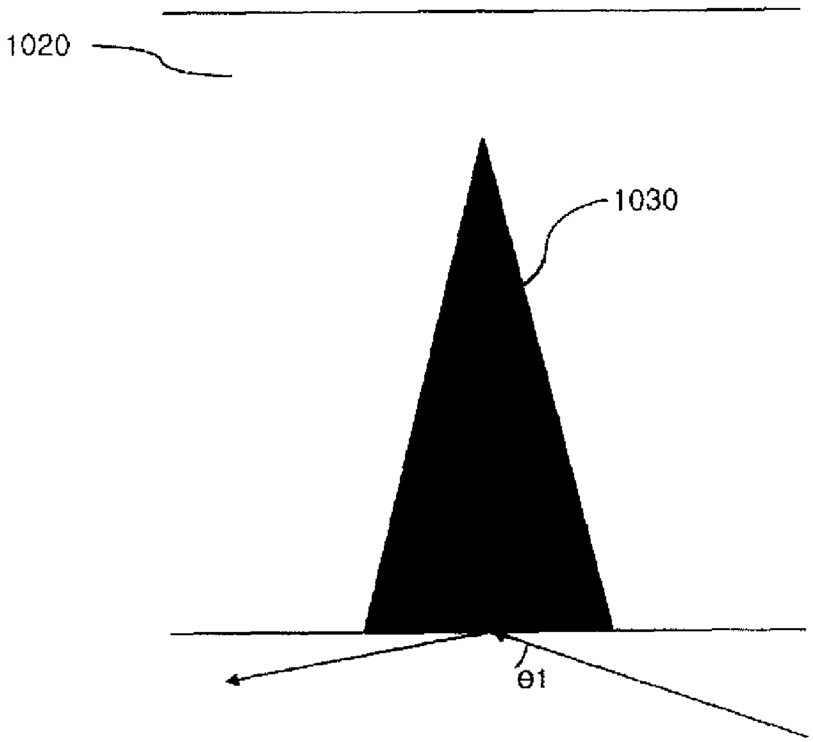

FIG. 21 illustrates a pattern unit 1030 with a flat bottom. Referring to FIG. 21, since the bottom of the pattern unit 1030 is flat, panel light diagonally incident upon the pattern unit 1030 may be reflected back toward a PDP by the bottom of the pattern unit 1030, thereby causing image smear and reducing the sharpness of an image displayed by a PDP.

Figure 22:
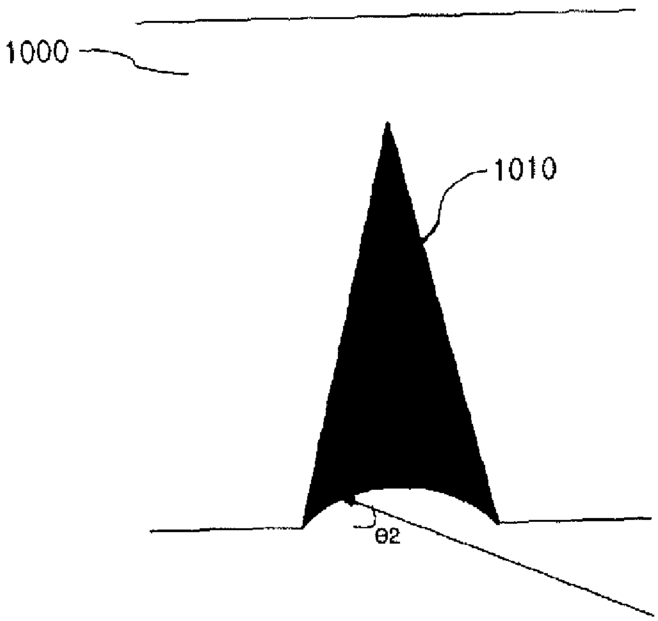

Referring to FIGS. 21 and 22, an incidence angle θ2 of panel light which is diagonally incident upon a pattern unit 1010 with a recessed bottom is less than an incidence angle θ1 of panel light which is incident upon the pattern unit 1030. Thus, the pattern unit 1010 can absorb panel light incident thereupon due to its recessed bottom, whereas the pattern unit 1030 reflects panel light incident thereupon. Therefore, by using the pattern unit 1010 with a recessed bottom, it is possible to reduce image smear and thus to improve the sharpness of an image.

Figure 23:
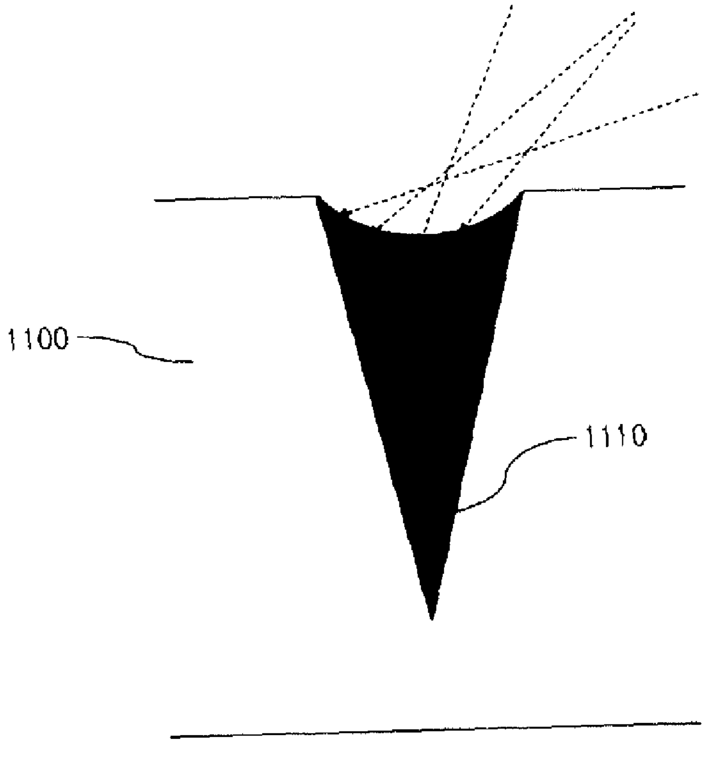

FIG. 23 is a cross-sectional view of an external light shield sheet including a pattern unit 1110 with a recessed bottom. Referring to FIG. 23, the external light shield sheet may be disposed so that the bottom of the pattern unit 1110 can face a viewer. In this case, it is possible to increase the range of incidence angles of external light that is can be absorbed by the bottom of the pattern unit 1110. In other words, it is possible to increase the incidence angle of external light with respect to the bottom of the pattern unit 1110 and thus to improve the absorption of external light by the pattern unit 1110.

Figure 24:
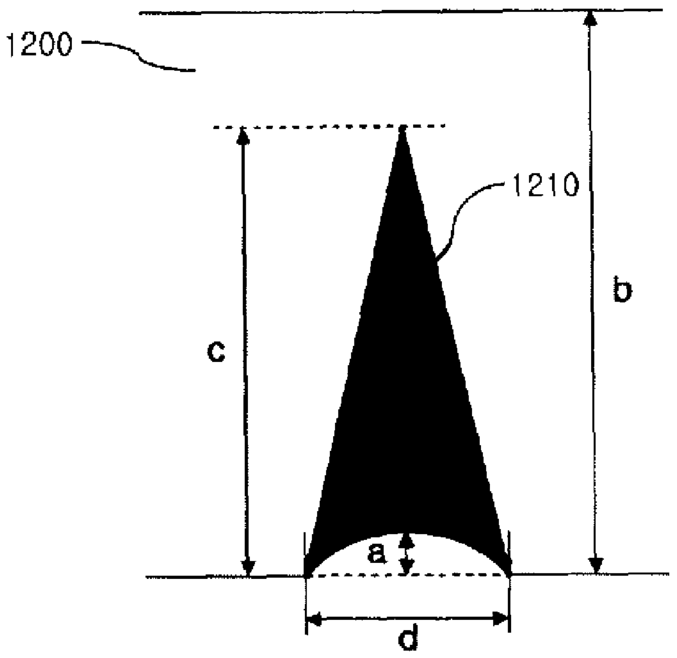

FIG. 24 is a cross-sectional view of a pattern unit 1210 with a recessed bottom. Table 2 presents experimental results indicating the relationships between a depth a of grooves, a bottom width d of pattern units with recessed bottoms, and the ability of the pattern units to reduce image smear.

TABLE 2

| Depth of Grooves (a) | Bottom Width of Pattern Units (d) | Smear Reduction |
|---|---|---|
| 0.5 μm | 27 μm | x |
| 1.0 μm | 27 μm | x |
| 1.5 μm | 27 μm | ○ |
| 2.0 μm | 27 μm | ○ |
| 2.5 μm | 27 μm | ○ |
| 3.0 μm | 27 μm | ○ |
| 3.5 μm | 27 μm | ○ |
| 4.0 μm | 27 μm | ○ |
| 4.5 μm | 27 μm | ○ |
| 5.0 μm | 27 μm | ○ |
| 5.5 μm | 27 μm | ○ |
| 6.0 μm | 27 μm | ○ |
| 6.5 μm | 27 μm | ○ |
| 7.0 μm | 27 μm | ○ |
| 7.5 μm | 27 μm | x |
| 8.0 μm | 27 μm | x |
| 9.0 μm | 27 μm | x |
| 9.5 μm | 27 μm | x |

Referring to Table 2, when the depth a is within the range of 1.5-7.0 μm, it is possible to reduce image smear and thus to increase the sharpness of an image.

In order to prevent the pattern unit 1210 from being damaged by an external shock and to facilitate the manufacture of the pattern unit 1210, the depth a may be within the range of 2-5 μm.

As described above with reference to FIG. 7, when a width d of the pattern unit 1210 is within the range of 18-35 μm, it is possible to secure an optimum aperture ratio for an effective emission of panel light and to increase the efficiency of shielding external light. Thus, the width d may be 3.6-17.5 times greater than the depth a.

When a height of the pattern unit 1210 is 80-170 μm, the slopes of a pair of slanted surfaces of the pattern unit 1210 can become suitable enough to effectively absorb external light and to effectively reflect panel light. Thus, the height c may be 16-85 times greater than the depth a.

When a thickness b of an external light shield sheet is 100-180 μm, it is possible to facilitate the transmission of panel light, to effectively absorb and shield external light and to enhance the durability of an external light shield sheet. Thus, the thickness b may be 20-90 times greater than the depth a.

Figure 25:
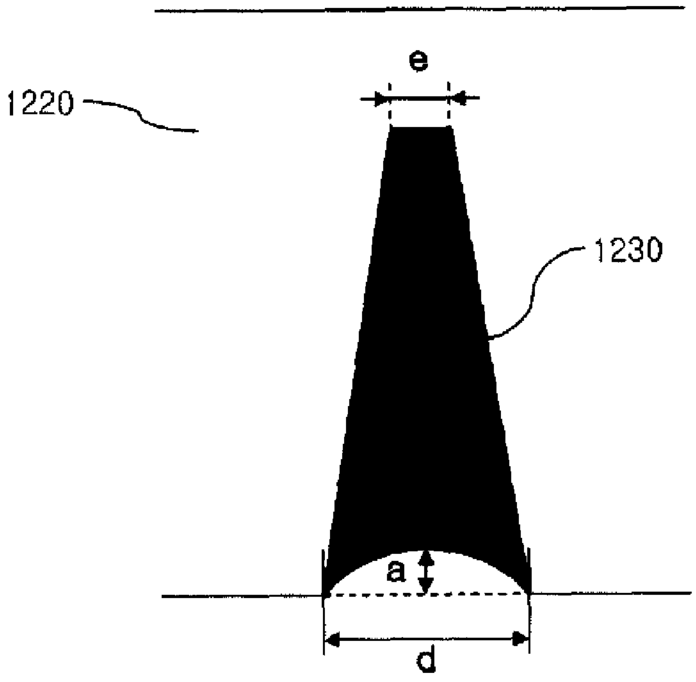

Referring to FIG. 25, a pattern unit 1230 may be trapezoidal. In this case, a top width e of the pattern unit 1230 may be less than a bottom width d of the pattern unit 1230. When the top width e is less than 10 μm, the slopes of a pair of slanted surfaces of the pattern unit 1230 can become suitable enough to effectively absorb external light and to effectively reflect panel light. Thus, the relationship between the depth a and the bottom width d may be the same as the relationship between the depth a and the width d of FIG. 24.

Figure 26:
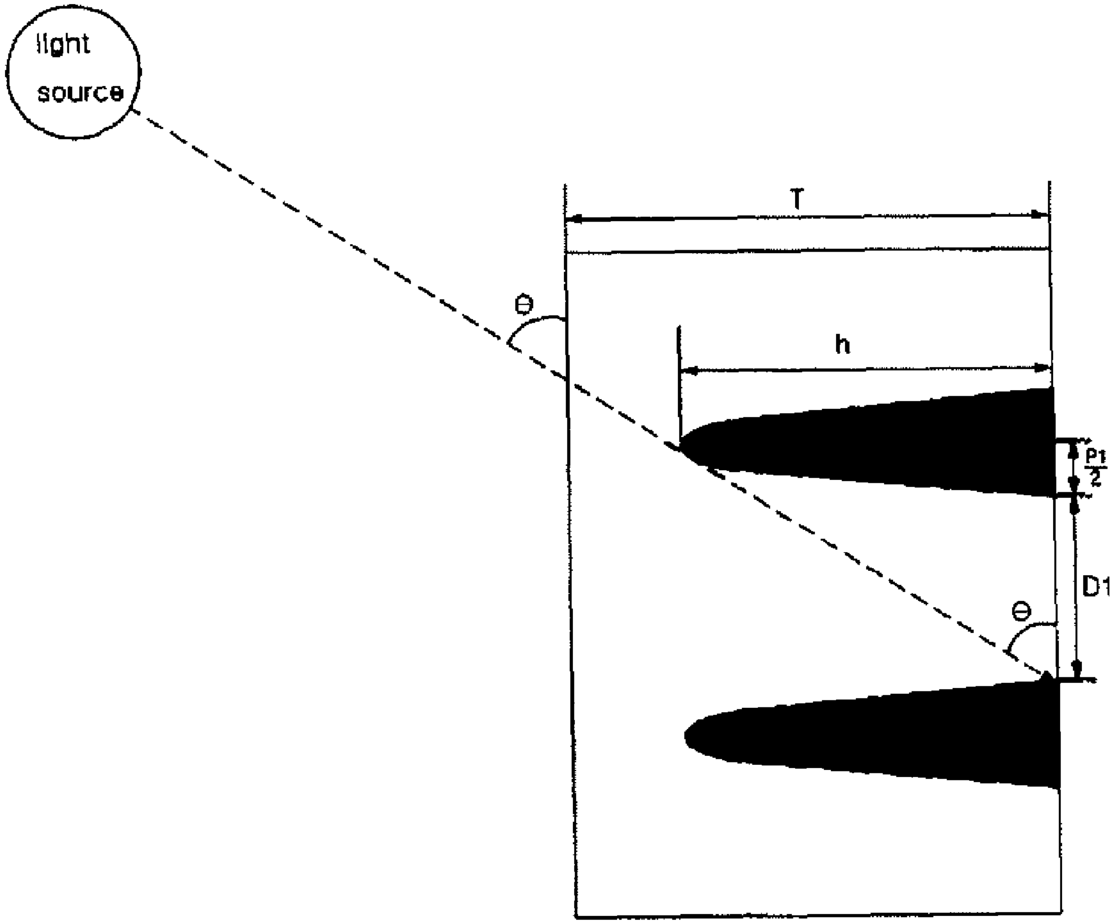
FIG. 26 is a cross-sectional view for explaining the relationship between a distance between a pair of adjacent pattern units of an external light shield sheet and a height of the pair of adjacent pattern units.

FIG. 26 is a cross-sectional view illustrating a structure of an external light shielding sheet for explaining the relationship between a thickness T of the external light shield sheet and a height h of a plurality of pattern units of the external light shield sheet.

Referring to FIG. 26, in order to enhance the durability of an external light shield sheet comprising a plurality of pattern units and secure the transmission of visible light emitted from a PDP for displaying images, the thickness T may be set to 100-180 μm.

When the height h is within the range of 80-170 μm, the manufacture of an external light shield sheet can be facilitated, an optimum aperture ratio can be obtained, and the shielding of external light and the reflection of light emitted from a PDP can be increased.

The height h can be varied according to the thickness T. In general, external light that considerably affects the bright room contrast of a PDP is highly likely to be incident upon a PDP from above. Therefore, in order to effectively shield external light, the height h may be within a predetermined percentage range of the thickness T.

Referring to FIG. 14, as the height h increases, the thickness of a base unit decreases, and thus, dielectric breakdown is more likely to occur. On the other hand, as the height h decreases, more external light is likely to be incident upon a PDP at a predetermined range of angles, and thus it becomes more difficult for an external light shield sheet to properly shield such external light.

Table 3 presents experimental results obtained by testing a plurality of external light shield sheets having the same thickness T and different pattern unit heights (h) for whether they cause dielectric breakdown and whether they can shield external light.

TABLE 3

| Thickness (T) of External Light Shield sheet | Height (h) of Pattern Units | Dielectric Breakdown | External Light Shielding |
|---|---|---|---|
| 120 μm | 120 μm | ○ | ○ |
| 120 μm | 115 μm | Δ | ○ |
| 120 μm | 110 μm | x | ○ |
| 120 μm | 105 μm | x | ○ |
| 120 μm | 100 μm | x | ○ |
| 120 μm | 95 μm | x | ○ |
| 120 μm | 90 μm | x | ○ |
| 120 μm | 85 μm | x | Δ |
| 120 μm | 80 μm | x | Δ |
| 120 μm | 75 μm | x | Δ |
| 120 μm | 70 μm | x | Δ |
| 120 μm | 65 μm | x | Δ |
| 120 μm | 60 μm | x | Δ |
| 120 μm | 55 μm | x | Δ |
| 120 μm | 50 μm | x | x |

Referring to Table 3, when the thickness T is 120 μm and the height h is greater than 115 μm, pattern units of an external light shield sheet are highly susceptible to dielectric breakdown, thereby increasing defect rates. When the height h is less than 115 μm, the pattern units are less susceptible to dielectric breakdown, thereby reducing defect rates. When the height h is less than 85 μm, the external light shielding efficiency of the pattern units is likely to decrease. When the height h is less than 60 μm, external light is likely to be directly incident upon a PDP.

When the thickness T is 1.01-2.25 times greater than the height h, it is possible to prevent dielectric breakdown of the upper portions of the pattern units and to prevent external light from being incident upon a PDP. In order to prevent dielectric breakdown of the pattern units and infiltration of external light into a PDP, to increase the reflection of light emitted from a PDP, and to secure optimum viewing angles, the thickness T may be 1.01-1.5 times greater than the height h.

Table 4 presents experimental results obtained by testing a plurality of external light shield sheets having different pattern unit bottom width-to-bus electrode width ratios for whether they cause the moire phenomenon and whether they can shield external light, when the width of bus electrodes that are formed on an upper substrate of a PDP is 70 μm.

TABLE 4

| Bottom Width of Pattern Units/Width of Bus Electrodes | Moire | External light shielding |
|---|---|---|
| 0.10 | Δ | x |
| 0.15 | Δ | x |
| 0.20 | x | Δ |
| 0.25 | x | ○ |
| 0.30 | x | ○ |
| 0.35 | x | ○ |
| 0.40 | x | ○ |
| 0.45 | Δ | ○ |
| 0.50 | Δ | ○ |
| 0.55 | ○ | ○ |
| 0.60 | ○ | ○ |

Referring to Table 4, when the bottom width of pattern units is 0.2-0.5 times greater than the width of bus electrodes, the moire phenomenon can be reduced and the amount of external light incident upon a PDP can be reduced. In particular, the bottom width of pattern units may be 0.25-0.4 times greater than the width of bus electrodes. In this case, it is possible to reduce the moire phenomenon, to effectively shield external light, and to secure a sufficient aperture ratio to discharge light emitted from a PDP.

Table 5 presents experimental results obtained by testing a plurality of external light shield sheets having different pattern unit bottom width-to-vertical barrier rib width ratios for whether they cause the moire phenomenon and whether they can shield external light, when the width of vertical barrier ribs that are formed on a lower substrate of a PDP is 50 μm.

TABLE 5

| Bottom Width of Pattern Units/Top Width of Vertical Barrier Ribs | Moire | External Light shielding |
|---|---|---|
| 0.10 | ○ | x |
| 0.15 | Δ | x |
| 0.20 | Δ | x |
| 0.25 | Δ | x |
| 0.30 | x | Δ |
| 0.35 | x | Δ |
| 0.40 | x | ○ |
| 0.45 | x | ○ |
| 0.50 | x | ○ |
| 0.55 | x | ○ |
| 0.60 | x | ○ |
| 0.65 | x | ○ |
| 0.70 | Δ | ○ |
| 0.75 | Δ | ○ |
| 0.80 | Δ | ○ |
| 0.85 | ○ | ○ |
| 0.90 | ○ | ○ |

Referring to Table 5, when the bottom width of pattern units is 0.3-0.8 times greater than the width of vertical barrier ribs, the moire phenomenon can be reduced and the amount of external light incident upon a PDP can be reduced. In particular, the bottom width of pattern units may be 0.4-0.65 times greater than the width of vertical barrier ribs. In this case, it is possible to reduce the moire phenomenon, to effectively shield external light, and to secure a sufficient aperture ratio to discharge light emitted from a PDP.

FIGS. 27 through 30 are cross-sectional views of filters. A filter may be disposed at the front of a PDP, and may include an AR/NIR sheet, an EMI shield sheet, an external light shield sheet, and an optical sheet.

Figure 27:
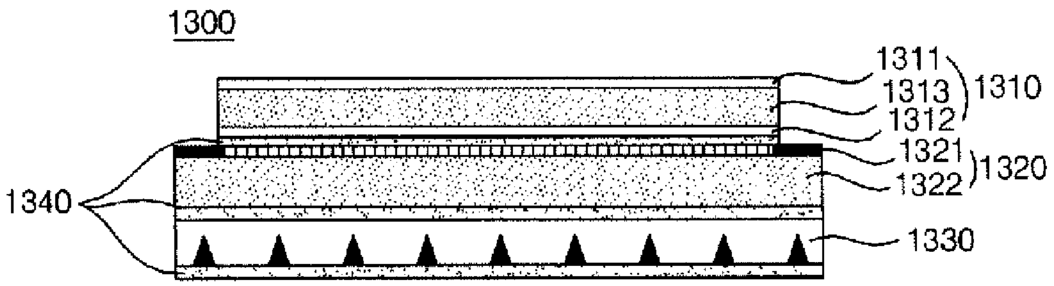
FIGS. 27 through 30 are cross-sectional views of filters.
Figure 28:
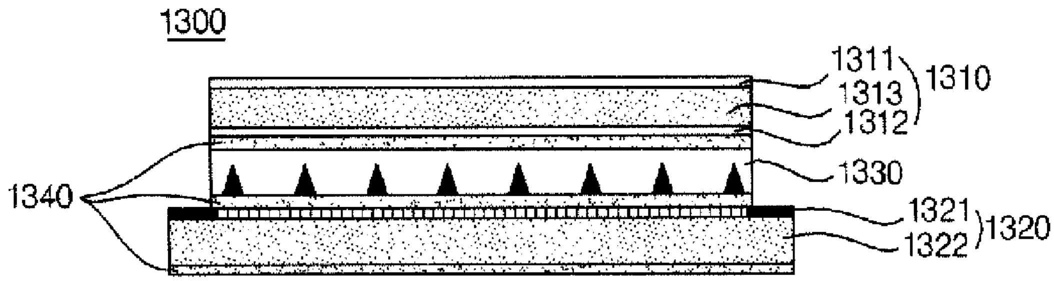

Referring to FIGS. 27 and 28, an AR/NIR sheet 1310 includes a base sheet 1313, which is formed of a transparent plastic material; an AR layer 1311, which is attached onto an entire surface of the base sheet 1313 and reduces glare by preventing the reflection of external light incident upon a PDP; and an NIR shield layer 1312, which is attached onto a rear surface of the base sheet 1313 and shields NIR rays emitted from a PDP so that signals provided by a device (such as a remote control transmitting signals using infrared rays) can be smoothly transmitted.

An EMI shield sheet 1320 can include a base sheet 1322 which is formed of a transparent plastic material and an EMI shield layer 1321 which is attached onto a surface of the base sheet 1322 and shields EMI generated by a PDP so that the EMI can be prevented from being released externally (to the outside). The EMI shield layer 1321 can be formed of a conductive material in a mesh form. In order to properly ground the EMI shield layer 1321, an invalid display zone on the EMI shield sheet 1320 where no images are displayed can be covered with a conductive material.

An external light source is generally located over the head of a user regardless of an indoor or outdoor environment. An external light shield sheet 1330 effectively shields external light so that black images can be rendered even blacker by a PDP.

An adhesive layer 1340 is interposed between the AR/NIR sheet 1310, the EMI shield sheet 1320, and the external light shield sheet 1330, so that the filter 1300 including the AR/NIR sheet 1310, the EMI shield sheet 1320, and the external light shield sheet 1330 can be firmly attached onto a PDP. In order to facilitate the manufacture of the filter 1300, the base sheets 1313 and 1322 may be formed of the same material.

Referring to FIG. 27, the AR/NIR sheet 1310, the EMI shield sheet 1320, and the external light shield sheet 1330 can be sequentially deposited or stacked. Alternatively, the AR/NIR sheet 1310, the external light shield sheet 1330, and the EMI shield sheet 1320 may be sequentially deposited or stacked, as illustrated in FIG. 28. The order in which the AR/NIR sheet 1310, the EMI shield sheet 1320, and the external light shield sheet 1330 are deposited is not restricted to those set forth herein and illustrated in the figures. At least one of the AR/NIR sheet 1310, the EMI shield sheet 1320, and the external light shield sheet 1330 may be optional.

Figure 29:
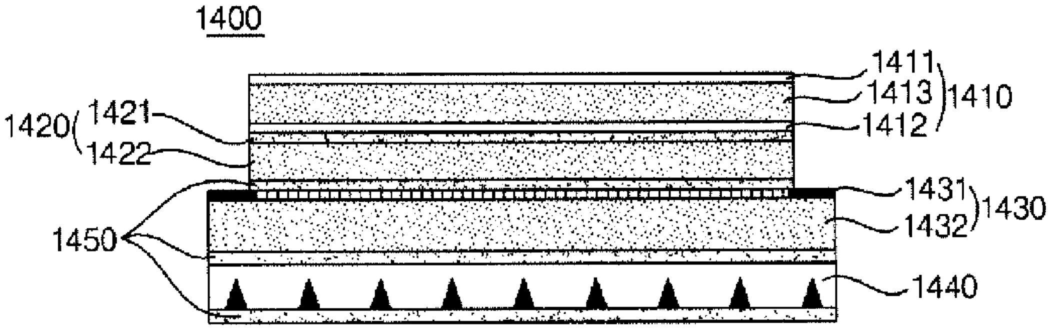
Figure 30:
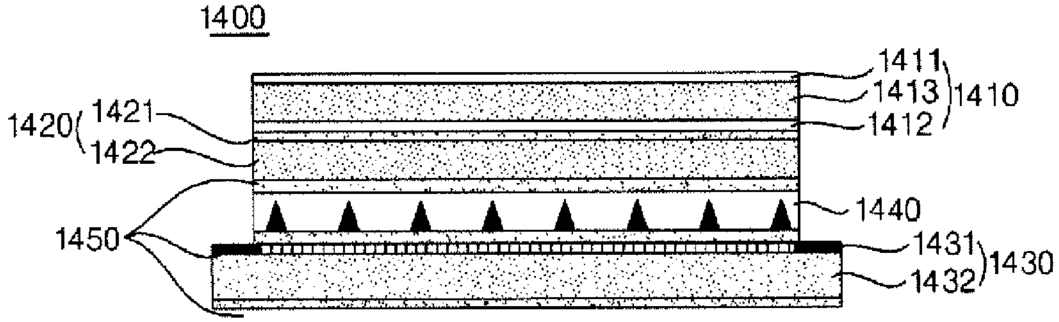

Referring to FIGS. 29 and 30, a filter 1400, which is disposed at the front of a PDP, includes an AR/NIR sheet 1410, an EMI shield sheet 1430, an external light shield sheet 1440, and an optical sheet 1420. The AR/NIR sheet 1410, the EMI shield sheet 1430, and the external light shield sheet 1440 may be the same as their respective counterparts illustrated in FIGS. 27 and 28. The optical sheet 1420 enhances the color temperature and luminance properties of light incident upon a PDP from above. The optical sheet 1420 includes a base sheet 1422 formed of a transparent plastic material, and an optical sheet layer 1421 which is formed of a dye and an adhesive on a front or rear surface of the base sheet 1422.

At least one of the base sheets 1313 and 1322 illustrated in FIGS. 27 and 28 and at least one of a base sheet 1413, a base sheet 1412, and the base sheet 1422 illustrated in FIGS. 29 and 30 may be optional. One of the base sheets 1313 and 1322 illustrated in FIGS. 27 and 28 and one of the base sheets 1413, 1412, and 1422 illustrated in FIGS. 29 and 30 may be formed of a rigid material such as glass, instead of being formed of a plastic material, so that the protection of a PDP can be enhanced. Whichever of the base sheets 1313 and 1322 illustrated in FIGS. 27 and 28 and the base sheets 1413, 1412, and 1422 illustrated in FIGS. 29 and 30 is formed of glass may be a predetermined distance apart from a PDP.

A filter may also include a diffusion sheet. The diffusion sheet can diffuse light incident upon a PDP so that the brightness of the PDP can be uniformly maintained. In addition, the diffusion sheet can widen vertical and horizontal viewing angles of a display screen by uniformly diffusing light emitted from a PDP. Moreover, the diffusion sheet can hide patterns formed on an external light shield sheet. Furthermore, the diffusion sheet can uniformly enhance the front luminance of a PDP through collection of light in a direction corresponding to a vertical viewing angle, and can enhance the antistatic property of a PDP.

The diffusion sheet may be comprised of a transparent or reflective diffusion film. In general, the diffusion sheet may be comprised of a polymer base sheet containing small glass particles. In some examples, the diffusion sheet may be comprised of a polymethyl-methacrylate (PMMA) base sheet. In this case, the diffusion sheet is thick and highly heat-resistant and can thus be applied to large-scale display devices, which can generate a considerable amount of heat.

As described above, the filter may be disposed at the front of a PDP. The filter may also be used in various display devices such as a liquid crystal display (LCD) and an organic light emitting diode (OLED).

It is possible to effectively realize black images and to improve the bright room contrast of a PDP by disposing an external light shield sheet for absorbing and shielding external light at the front of the PDP. Also, it is possible to reduce the probability of occurrence or perception of the moire phenomenon.

Various changes in form and details may be made in the example implementations described and shown, and other implementations are within the scope of the following claims.

What is claimed is:

1. A plasma display device comprising:

a plasma display panel in which a black matrix is formed; and a filter disposed at a front surface of the panel, wherein the filter comprises an external light shield sheet including a base unit and a pattern unit formed in a line on the base unit, and wherein an angle between the pattern unit and the black matrix is 1.5 to 3.5 degrees, and a thickness of the external light shield sheet is 1.01 to 2.25 times greater than a height of the pattern unit.

2. The plasma display device of claim 1, wherein a refractive index of the pattern unit is 0.3 times greater than and 1 times less than that of the base unit.

3. The plasma display device of claim 1, wherein a distance between the adjacent pattern units is 1.1 to 5 times greater than a width of a bottom of the pattern unit.

4. The plasma display device of claim 1, wherein a height of the pattern unit is 0.89 to 4.25 times greater than a distance between the adjacent pattern units.

5. A plasma display device comprising:

a plasma display panel; and a filter disposed at a front surface of the panel, wherein the filter comprises:

an external light shield sheet including a first base unit and a first pattern unit that is formed in a line on the first base unit and that has a refractive index lower than that of the first base unit; and an EMI shield sheet that is formed to be overlapped with the external light shield sheet and that includes a second base unit and a conductive second pattern unit formed in a line on the second base unit, wherein an angle between the first pattern unit and the second pattern unit is 40 to 50 degrees, and wherein a thickness of the external light shield sheet is 1.01 to 2.25 times greater than a height of the first pattern unit.

6. The plasma display device of claim 5, further comprising a black matrix formed in the panel, wherein an angle between the first pattern unit and the black matrix is 5 degrees or less.

7. The plasma display device of claim 5, further comprising a black matrix formed in the panel, wherein an angle between the second pattern unit and the black matrix is 30 to 60 degrees.

8. The plasma display device of claim 5, wherein a distance between the adjacent pattern units is 1.1 to 5 times greater than a width of a bottom of the first pattern unit.

9. The plasma display device of claim 5, wherein a height of the first pattern unit is 0.89 to 4.25 times greater than a distance between the adjacent pattern units.

10. A plasma display device comprising:

a plasma display panel in which a black matrix is formed; and a filter disposed at a front surface of the panel, wherein the filter comprises:

an external light shield sheet including a first base unit and a first pattern unit that is formed on a line on the first base unit and that has a refractive index lower than that of the first base unit; and an EMI shield sheet that is formed to be overlapped with the external light shield sheet and that includes a second base unit and conductive second and third pattern units that are formed in a line on the second base unit, wherein the second and third pattern units are formed to intersect, an angle between the first pattern unit and the second pattern unit is 40 to 50 degrees, an angle between the first pattern unit and the third pattern unit is 28 and 65 degrees, and an angle between the black matrix and the first pattern unit is 5 degrees or less.

11. The plasma display device of claim 10, wherein a refractive index of the first pattern unit is 0.3 times greater than and 1 times less than that of the first base unit.

12. The plasma display device of claim 10, wherein an angle between the second pattern unit and the third pattern unit is 60 to 130 degrees.

13. A filter for improving optical characteristics of a display panel in which a black matrix is formed, comprising:

an external light shield sheet including a base unit and a pattern unit formed in a line on the base unit, wherein an angle between the pattern unit and the black matrix is 1.5 to 3.5 degrees, and a thickness of the external light shield sheet is 1.01 to 2.25 times greater than a height of the pattern unit.

14. A filter for improving optical characteristics of a display panel, comprising:

an external light shield sheet including a first base unit and a first pattern unit that is formed in a line on the first base unit and that has a refractive index lower than that of the first base unit; and an EMI shield sheet that is formed to be overlapped with the external light shield sheet and that includes a second base unit and a conductive second pattern unit formed in a line on the second base unit, wherein an angle between the first pattern unit and the second pattern unit is 40 to 50 degrees, and wherein a thickness of the external light shield sheet is 1.01 to 2.25 times greater than a height of the pattern unit.

15. The filter of claim 14, further comprising a black matrix formed in the panel, wherein an angle between the first pattern unit and the black matrix is 5 degrees or less.

16. The filter of claim 14, further comprising a black matrix formed in the panel, wherein an angle between the second pattern unit and the black matrix is 30 to 60 degrees.

17. A filter for improving optical characteristics of a display panel in which a black matrix is formed, comprising:

an external light shield sheet including a first base unit and a first pattern unit that is formed in a line on the first base unit and that has a refractive index lower than that of the first base unit; and an EMI shield sheet that is formed to be overlapped with the external light shield sheet and that includes a second base unit and conductive second and third pattern units formed in a line on the second base unit, wherein the second and third pattern units are formed to intersect, an angle between the first pattern unit and the second pattern unit is 40 to 50 degrees, an angle between the first pattern unit and the third pattern unit is 28 and 65 degrees, and an angle between the black matrix and the first pattern unit is 5 degrees or less.

18. The filter of claim 17, wherein a refractive index of the first pattern unit is 0.3 times greater than and 1 times less than that of the first base unit.

19. The filter of claim 17, wherein an angle between the second pattern unit and the third pattern unit is 60 to 130 degrees.

* * * * *